(12) United States Patent
Cho

(10) Patent No.: US 11,342,405 B2
(45) Date of Patent: May 24, 2022

(54) DISPLAY DEVICE HAVING NOTCHED CONNECTION WIRING

(71) Applicant: SAMSUNG DISPLAY CO., LTD., Yongin-si (KR)

(72) Inventor: Seil Cho, Cheonan-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 15 days.

(21) Appl. No.: 16/928,807

(22) Filed: Jul. 14, 2020

(65) Prior Publication Data

US 2020/0343333 A1 Oct. 29, 2020

Related U.S. Application Data

(63) Continuation of application No. 16/358,322, filed on Mar. 19, 2019, now Pat. No. 10,748,980, which is a continuation of application No. 15/661,122, filed on Jul. 27, 2017, now Pat. No. 10,269,890.

(30) Foreign Application Priority Data

Feb. 24, 2017 (KR) .......................... 10-2017-0024982

(51) Int. Cl.
*H01L 27/32* (2006.01)
*H01L 51/00* (2006.01)
*H01L 23/528* (2006.01)

(52) U.S. Cl.
CPC ...... *H01L 27/3276* (2013.01); *H01L 23/5283* (2013.01); *H01L 51/0097* (2013.01); *H01L 2251/5338* (2013.01); *Y02E 10/549* (2013.01)

(58) Field of Classification Search
CPC ............ H01L 27/3276; H01L 23/5283; H01L 51/0097; H01L 2251/5338; G09F 9/301
See application file for complete search history.

(56) References Cited

U.S. PATENT DOCUMENTS

| | | | |
|---|---|---|---|
| 5,445,869 A | 8/1995 | Ishikawa et al. | |
| 9,203,050 B2 | 12/2015 | Jeong et al. | |
| 2012/0051005 A1 | 3/2012 | Vanfleteren et al. | |
| 2012/0062447 A1* | 3/2012 | Tseng ................ | G02F 1/136286 345/33 |
| 2015/0065840 A1 | 3/2015 | Bailey | |

(Continued)

FOREIGN PATENT DOCUMENTS

| | | |
|---|---|---|
| KR | 1020130008585 | 1/2013 |
| KR | 1020130042731 | 4/2013 |
| KR | 1020150125593 | 11/2016 |

OTHER PUBLICATIONS

European Search Report dated May 18, 2018 in corresponding European Application No. 17198097.2 (9 pages).

*Primary Examiner* — Julia Slutsker
(74) *Attorney, Agent, or Firm* — F. Chau & Associates, LLC

(57) ABSTRACT

A display device includes a substrate including a display region, a pad region spaced apart from the display region, and a bending region between the display region and the pad region. A plurality of pixel structures is positioned in the display region of the substrate. A plurality of pad wirings is positioned in the pad region of the substrate. A plurality of connection wirings electrically connect the pad wirings to the pixel structures. The connection wirings include a plurality of notches in the bending region.

20 Claims, 21 Drawing Sheets

(56) References Cited

U.S. PATENT DOCUMENTS

| | | |
|---|---|---|
| 2015/0179728 A1 | 6/2015 | Kwon et al. |
| 2016/0035812 A1* | 2/2016 | Kwon ............... H01L 29/66757 257/40 |
| 2016/0093644 A1 | 3/2016 | Ki et al. |
| 2016/0105950 A1 | 4/2016 | Drzaic et al. |
| 2018/0247992 A1 | 8/2018 | Cho |

* cited by examiner

FIG. 4
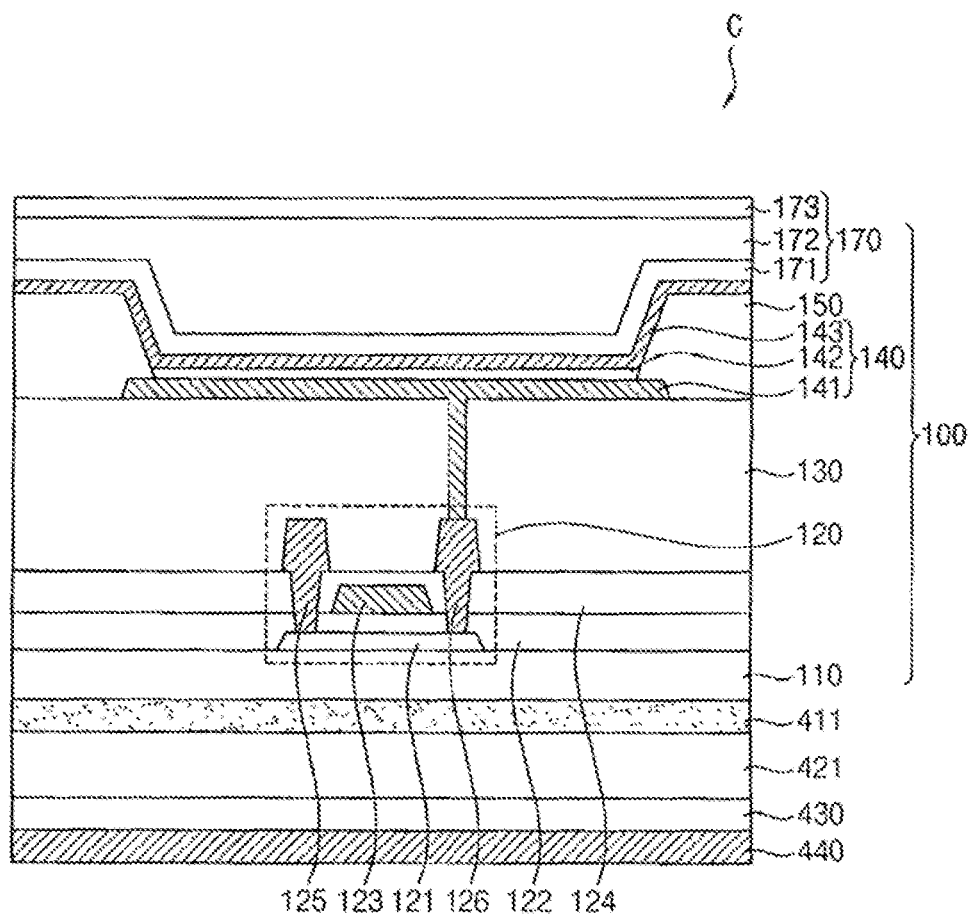
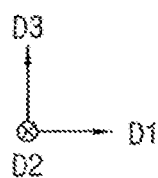

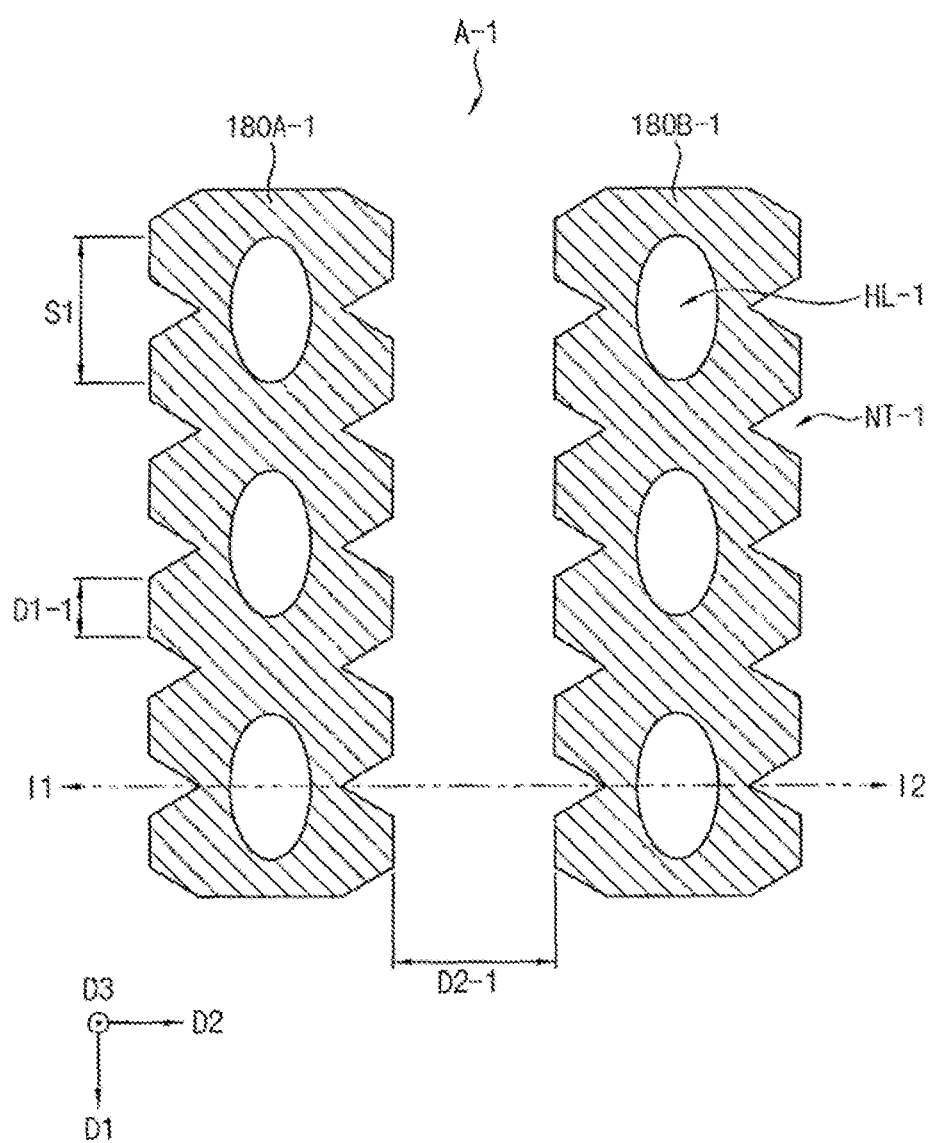

DISPLAY DEVICE HAVING NOTCHED CONNECTION WIRING

CROSS REFERENCE TO RELATED APPLICATION

This application is a Continuation of co-pending U.S. patent application Ser. No. 16/358,322, filed Mar. 19, 2019, which is a Continuation of U.S. patent application Ser. No. 15/661,122, filed on Jul. 27, 2017, which claims priority under 35 U.S.C. § 119 to Korean patent Application No. 10-2017-0024982 filed on Feb. 24, 2017, the disclosures of which are incorporated by reference herein in their entirety.

1. TECHNICAL FIELD

Exemplary embodiments of the present invention relate to a display device, and more particularly to a display device having notched connection wiring.

2. DISCUSSION OF RELATED ART

A flat panel display (FPD) device may be employed as a display device of an electronic device. The FPD device may be relatively lightweight and thin with respect to a cathode-ray tube (CRT) display device. Examples of the FPD device include a liquid crystal display (LCD) device and an organic light emitting display (OLED) device.

A flexible OLED device capable of bending or folding a portion of the OLED device may include lower and upper substrates, which have flexible materials. For example, the lower substrate included in the display panel may include a flexible material, and the upper substrate included in the display panel may have a thin film encapsulation structure.

By bending at least a portion of the substrate, the visibility of the display device can be increased at various angles, or a magnitude of non-display region in the display device can be reduced. However, defects such as a short circuit may occur in a manufacturing process of the bent/bendable display device.

SUMMARY

An exemplary embodiment of the present invention provides a display device capable of preventing or reducing a short circuit between adjacent wirings on the bending region.

According to an exemplary embodiment of the present invention, a display device includes a substrate including a display region, a pad region spaced apart from the display region, and a bending region between the display region and the pad region. A plurality of pixel structures is positioned in the display region of the substrate. A plurality of pad wirings is positioned in the pad region of the substrate. A plurality of connection wirings electrically connect the pad wirings to the pixel structures. The connection wirings include a plurality of notches in the bending region.

In an exemplary embodiment of the present invention, a first distance between two adjacent notches of the plurality of notches way be smaller than a second distance between two adjacent connection wirings of the plurality of connection wirings.

In an exemplary embodiment of the present invention, each of the connection wirings may include a plurality of holes in the bending region.

In an exemplary embodiment of the present invention, a first length of the holes may be smaller than the second distance.

In an exemplary embodiment of the present invention, the connection wirings may extend in the first direction in the bending region. The holes may be spaced apart from the notches along a second direction perpendicular to the first direction.

In an exemplary embodiment of the present invention, the notches may include a plurality of first notches positioned at a first side of each of the connection wirings, and a plurality of second notches positioned at a second side of each of the connection wirings. The second side may be opposite to the first side.

In an exemplary embodiment of the present invention, the connection wirings may extend in the first direction in the bending region. The first notches may be spaced apart from the second notches along a second direction perpendicular to the first direction.

In an exemplary embodiment of the present invention, the connection wirings may extend in the first direction in the bending region. Respective first notches of the plurality of first notches may each be substantially aligned with a corresponding second notch of the plurality of second notches along the second direction.

In an exemplary embodiment of the present invention, each of the notches of the plurality of notches may have an uneven shape when viewed from a plan view.

In an exemplary embodiment of the present invention, each of the pad wirings may include a plurality of third notches positioned at a first side of each of the pad wirings, and a plurality of fourth notches positioned at a second side of each of the pad wirings. The fourth side may be opposite to the third side.

In an exemplary embodiment of the present invention, the pad wirings may extend in a third direction. The third notches of the plurality of third notches may be spaced apart from the fourth notches of the plurality of fourth notches along a fourth direction orthogonal to the third direction.

In an exemplary embodiment of the present invention, the pad wirings may extend in a third direction. Respective third notches of the plurality of third notches may each be substantially aligned with corresponding fourth notches of the plurality of fourth notches along a fourth direction orthogonal to the third direction.

In an exemplary embodiment of the present invention, each of the connection wirings may include a first metal layer, and a second metal layer disposed on the first metal layer. The second metal layer may include aluminum (Al). A third metal layer may be disposed on the second metal layer.

In an exemplary embodiment of the present invention, the pixel structures may face away from the plurality of pad wirings when the substrate is bent.

In an exemplary embodiment of the present invention, the display device may include a protective film positioned under the display region and the pad region of the substrate. An adhesive layer may be disposed between the substrate and the protective film.

In an exemplary embodiment of the present invention, the connection wirings may be configured to receive at least one of data signals, scan signals, emission control signals, or power voltages via the pad wirings.

According to an exemplary embodiment of the present invention, a display device may include a substrate including a display region, a pad region spaced apart from the display region, and a bending region between the display region and the pad region. A plurality of pixel structures may be positioned in the display region of the substrate. A driving circuit may be positioned in the pad region of the substrate. The driving circuit may be configured to provide a driving signal to the pixel structures of the plurality of pixel structures. A plurality of connection wirings electrically connect the driving circuit to the plurality of pixel structures. The connection wirings include a plurality of notches in the bending region.

In an exemplary embodiment of the present invention, a first distance between two adjacent notches of the plurality of notches may be smaller than a second distance between two adjacent connection wirings of the plurality of connection wirings.

In an exemplary embodiment of the present invention, each of the connection wirings may include a plurality of holes in the bending region.

In an exemplary embodiment of the present invention, a first length of the holes may be smaller than the second distance.

In an exemplary embodiment of the present invention, the notches may include a plurality of first notches positioned at a first side of each of the connection wirings, and a plurality of second notches positioned at a second side of each of the connection wirings. The second side may be opposite to the first side.

In an exemplary embodiment of the present invention, the connection wirings of the plurality of connection wirings may each be connected to the driving circuit via at least one pad wiring of a plurality of pad wirings positioned in the pad region.

In an exemplary embodiment of the present invention, each of the pad wirings may include a plurality of third notches positioned at a first side of each of the pad wirings on the pad region, and a plurality of fourth notches positioned at a second side of each of the pad wirings on the pad region. The fourth side may be opposite to the third side.

According to an exemplary embodiment of the present invention, a display device may include a substrate including a display region and a pad region spaced apart from the display region, a plurality of pixel structures positioned in the display region of the substrate, a plurality of pad wirings positioned in the pad region of the substrate, the pad wirings including a plurality of first notches, and a plurality of connection wirings electrically connecting the pad wirings to the pixel structures.

In an exemplary embodiment of the present invention, a first distance between two adjacent first notches of the plurality of first notches may be smaller than a second distance between two adjacent pad wirings of the plurality of pad wirings.

In an exemplary embodiment of the present invention, the substrate may further include a bending region between the display region and the pad region. Each of the connection wirings includes a plurality of holes in the bending region.

In an exemplary embodiment of the present invention, the connection wirings may include a plurality of second notches in the bending region.

In a display device according to an exemplary embodiment of the present invention, notches may be formed in connection wirings on the bending region and formed in pad wirings on the pad region, and a distance between two adjacent notches may be smaller than a distance between two adjacent wirings. Thus, the display device according to an exemplary embodiment of the present invention may reduce or prevent an occurrence of a short circuit between adjacent wirings in the bending region or the pad region during a manufacturing process. Thus, a manufacturing yield of the display device may be increased and a manufacturing cost of the display device may be reduced.

BRIEF DESCRIPTION OF THE DRAWINGS

A more complete appreciation of the present invention will become more apparent by describing in detail exemplary embodiments thereof with reference to the accompanying drawings, in which:

FIG. 4 is an enlarged cross-sectional view illustrating an example of part 'C' of FIG. 2.

FIG. 6 is an enlarged plan view illustrating an example of part 'A' of FIG. 1.

DESCRIPTION OF EMBODIMENTS

Figure 1:
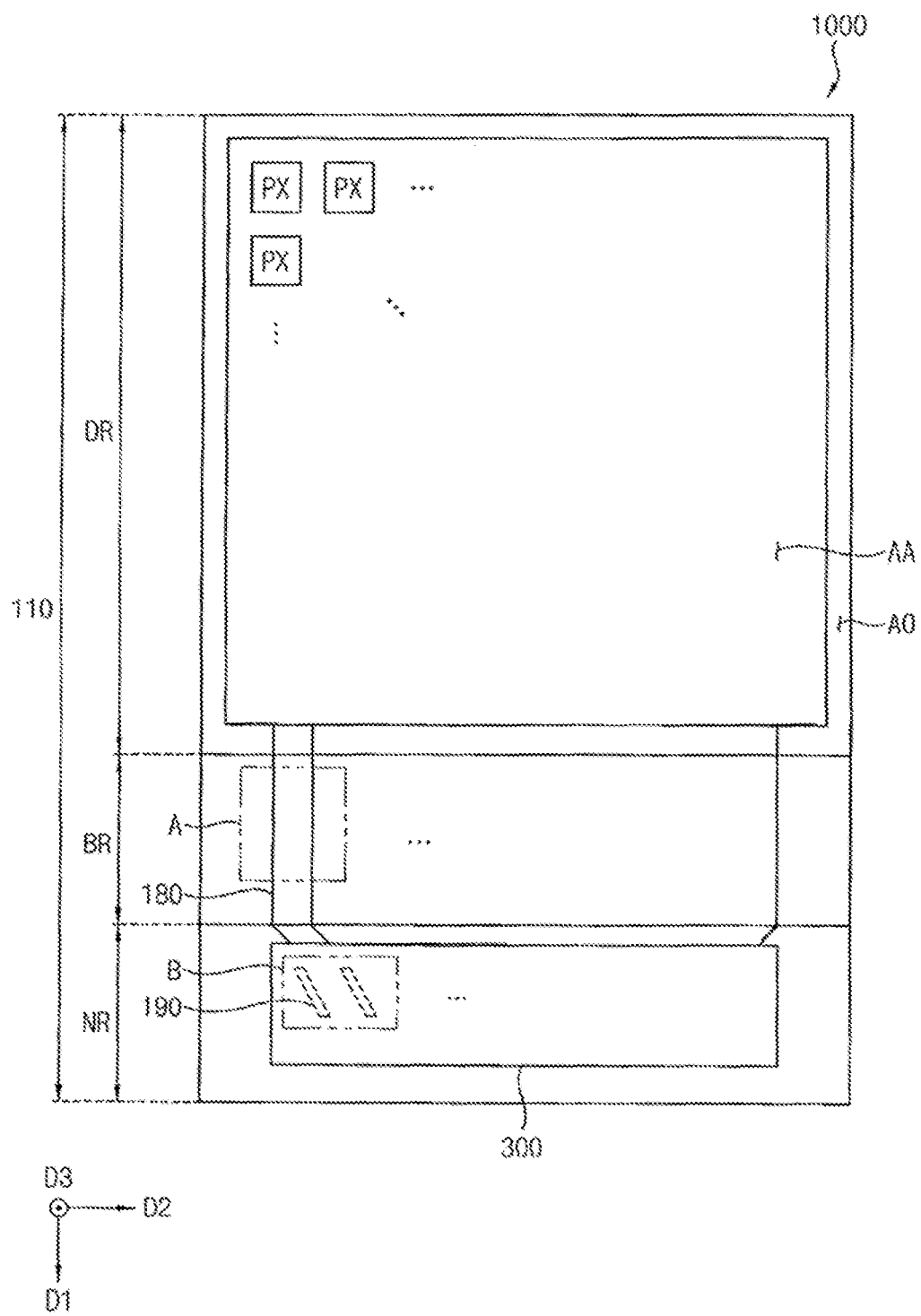
FIG. 1 is exploded plan view illustrating a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

Figure 2:
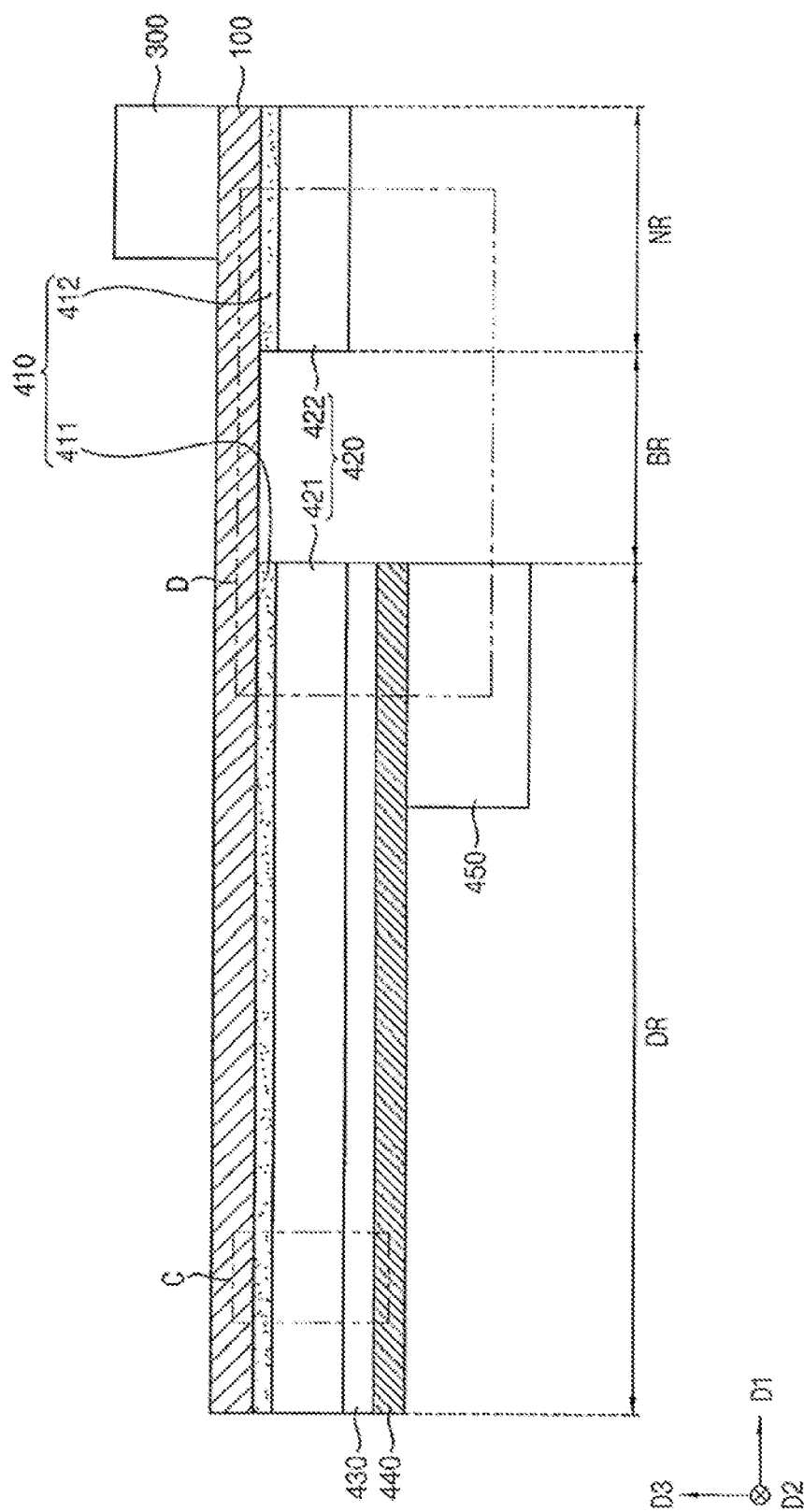
FIG. 2 is a cross-sectional view illustrating the display device of FIG. 1.
Figure 3:
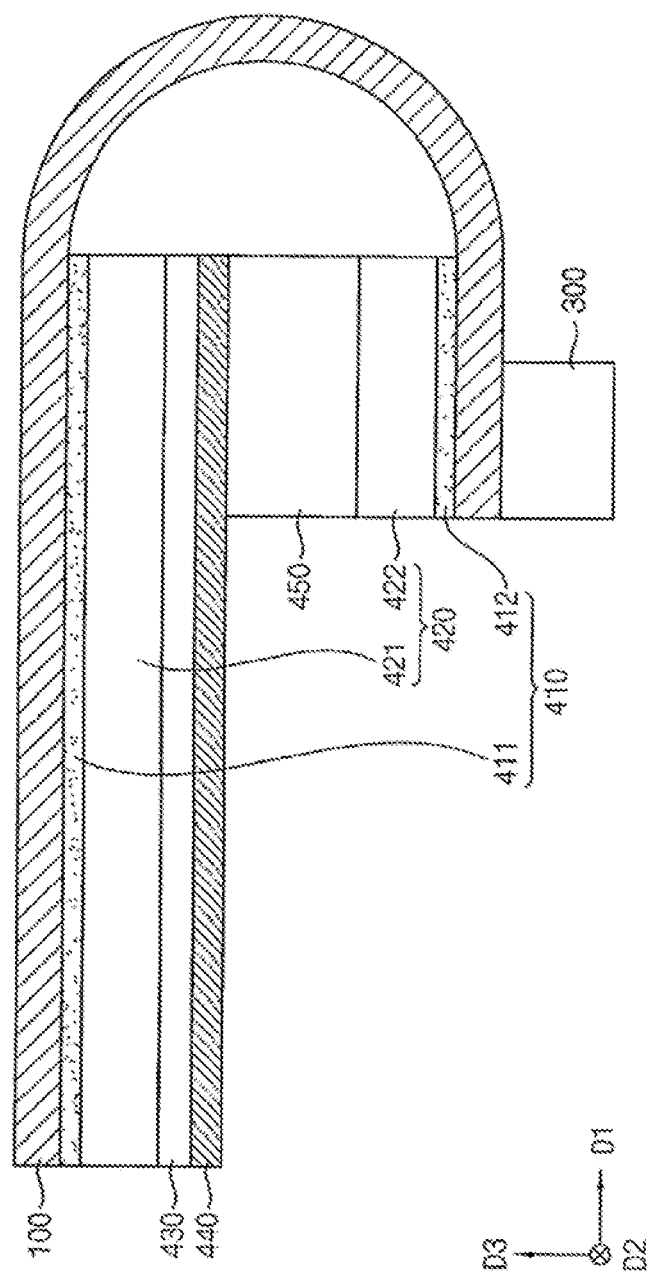
FIG. 3 is a cross-sectional view illustrating an example in which the display device of FIG. 1 is bent.

FIG. 1 is exploded plan view illustrating a display device according to an exemplary embodiment of the present invention. FIG. 2 is a cross-sectional view illustrating the display device of FIG. 1. FIG. 3 is a cross-sectional view illustrating an example in which the display device of FIG. 1 is bent.

Referring to FIGS. 1 through 3, a display device 1000 may include a display panel 100, a driving circuit 300, and a lower structure.

Referring to FIG. 1, the display panel 100 may include a plurality of pixels PX on a substrate 110. The substrate 110 may include a display region DR, a bending region BR, and a pad region NR. The display region DR may include an active region AA and an outer region AO. The plurality of pixels PX may be positioned in the active region AA of the display region DR. In an exemplary embodiment of the present invention, the pixels PX may include an organic light emitting diode (e.g., a pixel structure) and may be arranged in the active region AA in a matrix form. An encapsulation structure for the pixels PX may be formed in the outer region AO of the display region DR. The bending region BR may be positioned between the display region DR and the pad region NR. The bending region BR of the substrate 110 may be bendable or bent. In an exemplary embodiment of the present invention, the substrate 110 may be outwardly bent on an axis with respect to a second direction D2 in the bending region BR such that a light emitting structures 140, such as a pixel structure, (see, e.g., FIG. 4) faces outward. Thus, the non-display region on which an image is not displayed might not be visible to a user. The pad region NR may be spaced from the display region DR. Structures (e.g., pad wirings 190) connecting external devices such as the driving circuit 300 may be positioned in the pad region NR. Thus, the pixels PX may receive a driving signal, or a power supply voltage, which may drive the pixels PX.

The driving circuit 300 may provide the driving signal to the pixels PX via connection wirings 180 and the pad wirings 190. Here, the driving signal may include a scan signal, a data signal, and/or an emission control signal, which may drive the pixel PX. In an exemplary embodiment of the present invention, the driver circuit 300 may be disposed directly on the substrate 110 in the pad region NR in a chip-on-plastic (COP) manner. For example, the driving circuit 300 may be mounted on the pad wiring 190 using an anisotropic conductive film (ACF).

The connection wiring 180 may electrically connect the driving circuit 300 to the pixel PX (or the pixel structure). The connection wiring 180 may include notches in the bending region BR and/or the pad region NR. For example, each of the notches may have an uneven shape such as a triangular shape, a rectangular shape, or a semicircular shape when viewed from a plan view. Thus, the length of a straight portion of the connection wiring 180 may be shortened, thus reducing or preventing an occurrence of a short circuit between adjacent wirings in the bending region BR and/or the pad region NR.

In an exemplary embodiment of the present invention, each of the connection wirings 180 may include a plurality of first notches positioned at a first side of each connection wiring 180 in the bending region BR and/or the pad region NR and a plurality of second notches positioned at a second side of each connection wiring 180. The second side may be opposite to the first side. The connection wiring 180 may include a plurality of holes on the bending region BR. For example, the holes of the connection wiring 180 may penetrate the connection wiring 180 in a vertical direction (e.g., a third direction D3 orthogonal to a first direction D1 and a second direction D2). Both of a distance between two adjacent first notches (e.g., an interval between the first notches) and a distance between two adjacent second notches (e.g., an interval between the second notches) may be smaller than a distance between two adjacent connection wirings 180 (e.g., an interval between the connection wirings 180), thus reducing or eliminating an occurrence of a short circuit between adjacent connection wirings 180. The shape and arrangement of the notches of the connection wiring 180 formed in the bending region BR and/or the pad region NR will be described in more detail below with reference to FIGS. 6 through 12.

In an exemplary embodiment of the present invention, each of the pad wirings 190 may include a plurality of third notches positioned at a first side of each pad wiring 190 and a plurality of fourth notches positioned at a second side of each pad wiring 190 in the pad region NR. The second side may be opposite to the first side. For example, each of the third and fourth notches may have an uneven shape such as a triangular shape, a rectangular shape, or a semicircular shape when viewed from a plan view. A distance between two adjacent third notches (e.g., and interval between the third notches) and a distance between two adjacent fourth notches (e.g., and interval between the fourth notches) may be shorter than a distance between two adjacent pad wirings 190 (e.g., and interval between the pad wirings 190), thus reducing or eliminating an occurrence of a short circuit between adjacent pad wirings 190. The shape and arrangement of the notches of the pad wiring 190 will be described in more detail below with reference to FIGS. 13 through 18.

Referring to FIG. 2, the display device 1000 may include the lower structure under the display panel 100. The lower structure may include a first adhesive layer 410, a protective film 420, a second adhesive layer 430, a heat sink plate 440, and/or a third adhesive layer 450.

The protective film 420 may include a first protective film pattern 421 and a second protective film pattern 422. The first protective film pattern 421 may be positioned in the display region DR, and the second protective film pattern 422 may be positioned in the pad region NR. Thus, the bottom surface of the display panel 100 corresponding to the bending region BR may be exposed. The protective film 420 may include polyethylene terephthalate (PET), polyethylene naphthalate (PEN), or polypropylene (PP).

The first adhesive layer 410 may be disposed between the protective film 420 and the display panel 100 and may adhere the protective film 420 to the display panel 100. The first adhesive layer 410 may include a first adhesive layer pattern 411 overlapping the first protective film pattern 421 and a second adhesive layer pattern 412 overlapping the second protective film pattern 422 along the third direction D3. The first adhesive layer 410 may be indirect contact with the bottom surface of the display panel 100. The first adhesive layer 410 may include an acryl-based adhesive, a silicone-based adhesive, or a urethane-based adhesive.

The heat sink plate 440 may be positioned below the bottom surface of the protective film 420. The second adhesive layer 430 may be disposed between the protective film 420 and the heat sink plate 440 and may adhere the heat sink 440 to the protective film 420. The heat sink plate 440 may be disposed under the display panel 100 and may absorb heat generated from the display panel 100. When the heat generated from the display panel 100 is not absorbed, the performance of the display panel 100 may be reduced and the lifespan of the pixels PX may be shortened. The heat sink plate 440 may include a material having relatively high thermal conductivity.

Referring to FIG. 3, as the bending region BR is bent, the pad region NR can be positioned at a rear of the display device 1000. In an exemplary embodiment of the present invention, the bending region BR may be bent on an axis with respect to the second direction D2, and the second protective film pattern 422 may be positioned below a bottom surface of the heat sink plate 440. After the bending region BR is bent, the third adhesive layer 450 may be positioned between the second protective film pattern 422 and the heat sink plate 440. In this case, the second protective film pattern 422 and the heat sink 440 may be fixed by the third adhesive layer 450. In addition, the third adhesive layer 450 may absorb external impacts. As an example, the third adhesive layer 450 may include urethane, or rubber.

Figure 5A:
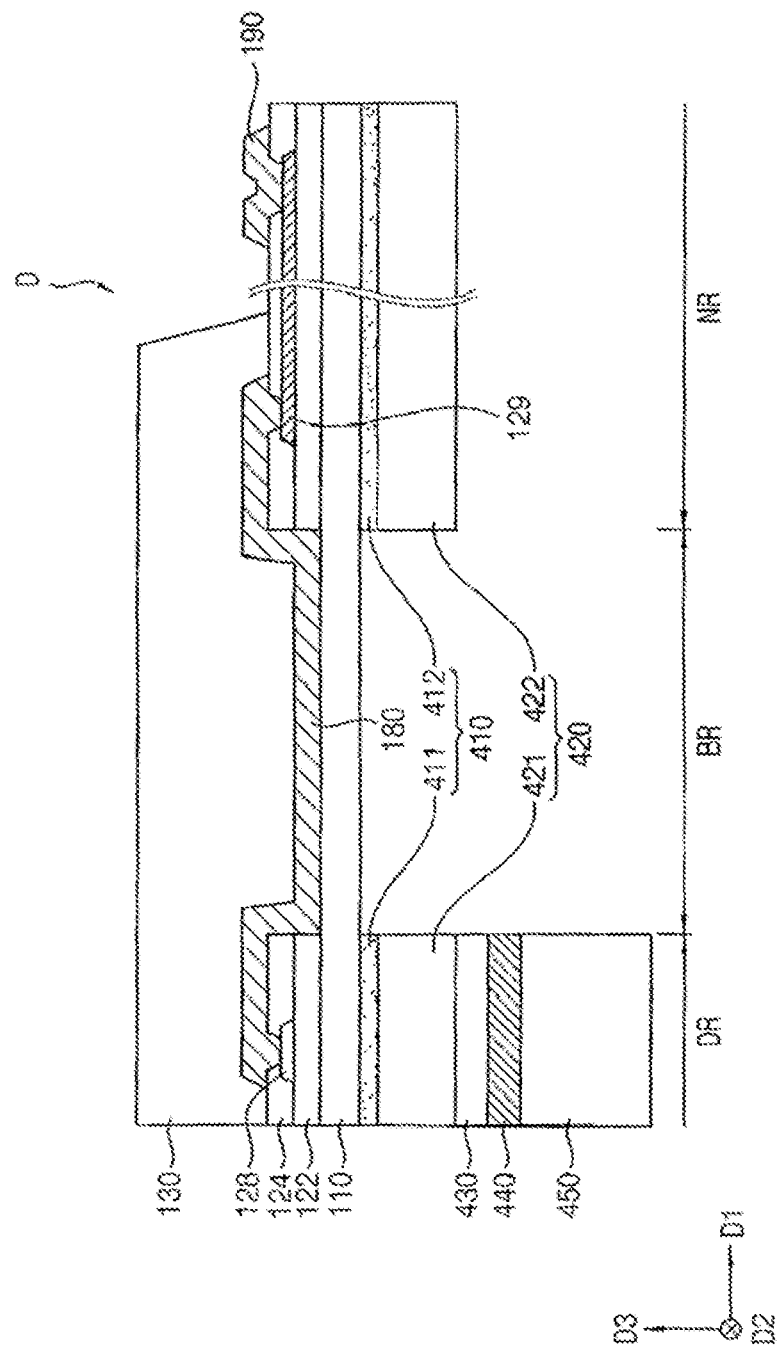
FIG. 5A is an enlarged cross-sectional view illustrating an example of part 'D' of FIG. 2.

FIG. 4 is an enlarged cross-sectional view illustrating an example of part 'C' of FIG. 2. FIG. 5A is an enlarged cross-sectional view illustrating an example of part 'D' of FIG. 2.

Referring to FIGS. 4 and 5A, the display panel 100 may include the substrate 110, a semiconductor element 120, a first conductive pattern 128, a second conductive pattern 129, a planarization layer 130, a light emitting structure 140, a pixel defining layer 150, a thin film encapsulation (TFE) structure 170, and a connection wiring 180. The display panel 100 may be a flexible display panel including the flexible substrate 110 and the TFE structure 170.

Referring to FIG. 4, the substrate 110 may include a flexible transparent material such as a flexible transparent resin substrate (e.g., a polyimide substrate). For example, the polyimide substrate may include a first polyimide layer, a first barrier film layer, a second polyimide layer, and a second barrier film layer. Since the polyimide substrate is relatively thin and flexible, the polyimide substrate may be disposed on a rigid glass substrate to help support the formation of the semiconductor element 120 and the light emitting structure (e.g., a lower electrode 141, a light emitting layer 142, and an upper electrode 143, etc). Thus, the substrate 110 may have a structure in which the first polyimide layer, the first barrier film layer, the second polyimide layer, and the second barrier film layer are stacked sequentially on the rigid glass substrate. For example, after an insulating layer (e.g., a buffer layer) is formed on the second barrier layer, the semiconductor element 120 and the light emitting structure 140 may be disposed on the insulating layer. After the semiconductor element 120 and the light emitting structure 140 are formed on the insulating layer, the rigid glass substrate on which the polyimide substrate is disposed may be removed.

A buffer layer may be disposed on the substrate 110. The buffer layer may be disposed on substantially the entire substrate 110. The buffer layer may reduce or prevent a diffusion of metal atoms and/or impurities from the substrate 110 into the semiconductor element 120. Additionally, the buffer layer may control a rate of a heat transfer in a crystallization process for forming the active layer 121, thus obtaining substantially uniform the active layer 121. The buffer layer may increase a surface flatness of the substrate 110 when a surface of the substrate 110 is relatively irregular. According to a type of the substrate 110, at least two buffer layers may be provided on the substrate 110, or the buffer layer may be omitted. For example, the buffer layer may include a silicon compound, or a metal oxide.

The semiconductor element 120 may be disposed on the substrate 110. The semiconductor element 120 may include an active layer 121, gate insulation layer 122, a gate electrode 123, an insulating interlayer 124, a source electrode 125 and a drain electrode 126.

The active layer 121 may be disposed on the substrate 110. The active layer 121 may include an oxide semiconductor, an inorganic semiconductor (e.g., amorphous silicon, polysilicon, etc.), or an organic semiconductor.

The gate insulation layer 122 may be disposed on the active layer 121. The gate insulation layer 122 may substantially cover the active layer 121, and may be disposed on the substrate 110. For example, the gate insulation layer 122 may at least partially cover the active layer 121 on the substrate 110, and may have a substantially level surface without a step around the active layer 121. Alternatively, the gate insulation layer 122 may substantially cover the active layer 121 on the substrate 110, and may be disposed as a substantially uniform thickness along a profile of the active layer 121. In an exemplary embodiment of the present invention, the gate insulation layer 122 may expose an upper surface of the substrate 110 that is located in a portion of the bending region BR and the pad region NR. The gate insulation layer 122 may include a silicon compound, or a metal oxide.

The gate electrode 123 may be disposed on a portion of the gate insulation layer 122 under which the active layer 121 is positioned. The gate electrode 123 may include a metal, a metal alloy, metal nitride, conductive metal oxide, or transparent conductive materials.

The insulating interlayer 124 may be disposed on the gate electrode 123. The insulating interlayer 124 may substantially cover the gate electrode 123, and may be disposed on the gate insulation layer 122. For example, the insulating interlayer 124 may at least partially cover the gate electrode 123 on the gate insulation layer 122, and may have a substantially level surface without a step around the gate electrode 123. Alternatively, the insulating interlayer 124 may cover the gate electrode 123 on the gate insulation layer 122, and may be disposed as a substantially uniform thickness along a profile of the gate electrode 123. In an exemplary embodiment of the present invention, the insulating interlayer 124 may expose an upper surface of the substrate 110 that is located in a portion of the bending region BR and the pad region NR. The insulating interlayer 124 may include a silicon compound, or a metal oxide.

The source electrode 125 and the drain electrode 126 may be disposed on the insulating interlayer 124. The source electrode 125 may be in direct contact with a first side of the active layer 121 via a contact hole formed by removing a portion of the gate insulation layer 122 and the insulating interlayer 124. The drain electrode 126 may be in direct contact with a second side of the active layer 121 via a contact hole formed by removing another portion of the gate insulation layer 122 and the insulating interlayer 124. Each of the source electrode 125 and the drain electrode 126 may include a metal, an alloy, a metal nitride, a conductive metal oxide, or one or more transparent conductive materials. These may be used alone or in a suitable combination thereof. In an exemplary embodiment of the present invention, each of the source and drain electrodes 125 and 126 may have a multi-layered structure.

Referring to FIG. 5A, the driving circuit (or the external device) may provide the data signal, the scan signal, the emission control signal, or the power voltage to the pixels via the pad wiring 190, the second conductive pattern 129, the connection wiring 180, and the first conductive pattern 128.

The first conductive pattern 128 may be positioned in the edge of the display region DR (e.g., the outer region AO described in FIG. 1) on the gate insulation layer 122. The first conductive pattern 128 may be one among a plurality of the lines connected to the pixels. For example, the first conductive pattern 128 may be one of a data signal line, a scan signal line, an emission control signal line, pr a power supply line.

The second conductive pattern 129 may be positioned in the pad region NR on the gate insulation layer 122. The second conductive pattern 129 may be electrically connected to the pad wiring 190.

The connection wiring 180 may be disposed on the substrate 110 in the bending region BR, and may be disposed on the insulating interlayer 124 in the edge of the display region DR and the portion of the pad region NR. The connection wiring 180 may be in direct contact with the first conductive pattern 128 via a contact hole formed by removing a portion of the insulating interlayer 124 positioned in the edge of the display region DR, and may be in direct contact with the second conductive pattern 129 via a contact hole formed by removing a portion of the insulating interlayer 124 positioned in the pad region NR. The planarization layer 130 may be disposed on the connection wiring 180.

The pad wiring 190 may be disposed on the insulating interlayer 124 in the pad region NR. The pad wiring 190 may be in direct contact with the second conductive pattern 129 via a contact hole formed by removing a portion of the insulating interlayer 124 located in the pad region NR.

In an exemplary embodiment of the present invention, the first conductive pattern 128, the second conductive pattern 129, and the gate electrode 123 may be substantially simultaneously formed using a same material. The connection wiring 180, the pad wiring 190, the source electrode 125, and the drain electrode 126 may be substantially simultaneously formed using a same material.

In an exemplary embodiment of the present invention, the connection wiring 180 and the pad wiring 190 may have a multi-layered structure including aluminum (Al) layer. For example, the connection wiring 180 and the pad wiring 190 may have a triple-layered structure including titanium/aluminum/titanium (Ti/Al/Ti) layers. In this case, a titanium (Ti) layer positioned at the uppermost layer may be damaged during etching and cleaning processes. A short circuit between the connection wirings 180 or between the pad wirings 190 may occur through an interaction of particles of the connection wiring 180 or particles of the pad wiring 190 (e.g., titanium particles). Thus, the connection wirings 180 and the pad wirings 190 may include notches to prevent a relatively long arrangement of particles in a straight line. In addition, the connection wiring 180 may include the plurality of holes on the bending region BR to have a high flexibility. The plurality of holes may further prevent a relatively long arrangement of particles in a straight line.

Thus, the driving circuit (or the external device) may be electrically connected to the pad wiring 190, and may provide the data signal, the scan signal, the emission control signal, or the power supply voltage to the pixels via the pad wiring 190, the second conductive pattern 129, the connection wiring 180, and the first conductive pattern 128.

Referring again to FIG. 4, the planarization layer 130 may be disposed on the source electrode 125 and the drain electrode 126. The planarization layer 130 may substantially cover the source electrode 125 and the drain electrode 126. In an exemplary embodiment of the present invention, the planarization layer 130 may be relatively thick and may at least partially cover the source and drain electrodes 125 and 126. In this case, the planarization layer 130 may have a substantially flat upper surface, and a planarization process may be further performed on the planarization layer 130 to implement the flat upper surface of the planarization layer 130. Alternatively, the planarization layer 130 may substantially cover the source and drain electrodes 125 and 126, and may be disposed as a substantially uniform thickness along a profile of the source and drain electrodes 125 and 126. The planarization layer 130 may include organic materials or inorganic materials.

The lower electrode 141 may be disposed on the planarization layer 130. The lower electrode 141 may be in direct contact with the drain electrode 126 via a contact hole formed by removing a portion of the planarization layer 130. The lower electrode 141 may be electrically connected to the semiconductor element 120. The lower electrode 141 may include a metal, a metal alloy, a metal nitride, a conductive metal oxide, or one or more transparent conductive materials. These may be used alone or in a suitable combination thereof. In an exemplary embodiment of the present invention, the lower electrode 141 may have a multi-layered structure.

The pixel defining layer 150 may be disposed on the planarization layer 130, and may expose a portion of the lower electrode 141. The light emitting layer 142 may be disposed on the portion of the lower electrode 141 exposed by the pixel defining layer 150. In an exemplary embodiment of the present invention, the pixel defining layer 150 may expose the bending region BR and the pad region NR. The pixel defining layer 150 may include organic materials or inorganic materials.

The light emitting layer 142 may be disposed on a portion where the portion of the lower electrode 141 is exposed. The light emitting layer 142 may be formed using at least one of light emitting materials capable of generating different colors of light (e.g., a red color of light, a blue color of light, or a green color of light) according to sub-pixels. Alternatively, the light emitting layer 142 may generate a white color of light by stacking a plurality of light emitting materials capable of generating different colors of light such as a red color of light, a green color of light, and a blue color of light. In this case, a color filter may be disposed on the light emitting layer 142.

The upper electrode 143 may be disposed on the pixel defining layer 150 and the light emitting layer 142. The upper electrode 143 may include a metal, a metal alloy, a metal nitride, a conductive metal oxide, or one or more transparent conductive materials.

The TFE structure 170 may be disposed on the upper electrode 143. The TFE structure 170 may include a first TFE layer 171, a second TFE layer 172, and a third TFE layer 173. For example, the first TFE layer 171 may be disposed on the upper electrode 143. The first TFE layer 171 may substantially cover the upper electrode 143, and may be disposed as a substantially uniform thickness along a profile of the upper electrode 143. The first TFE layer 171 may reduce or prevent the light emitting structure 140 from being deteriorated by the permeation of moisture, water, or oxygen. In addition, the first TFE layer 171 may protect the light emitting structure 140 from external impacts. The first TFE layer 171 may include one or more inorganic materials. The second TFE layer 172 may be disposed on the first TFE layer 171. The second TFE layer 172 may increase the flatness of the display device 100, and may protect the light emitting structure 140. The second TFE layer 172 may include one or more organic materials. The third TFE layer 173 may be disposed on the second TE layer 172. The third TFE layer 173 may substantially cover the second TFE layer 172, and may be disposed as a substantially uniform thickness along a profile of the second TFE layer 172. The third TFE layer 173 together with the first TFE layer 171 and the second TFE layer 172 may prevent the light emitting structure 140 from being deteriorated by the permeation of moisture, water, or oxygen. In addition, the third TFE layer 173 together with the first TFE layer 171 and the second TFE layer 172 may protect the light emitting structure 140 from external impacts. The third TFE layer 173 may include one or more inorganic materials.

Referring to FIG. 4, according to an exemplary embodiment of the present invention, the semiconductor element 120 may have a top gate structure. However, the structure of the semiconductor element 120 is not limited thereto. For example, the semiconductor element may have a bottom gate structure.

Referring to FIG. 4, according to an exemplary embodiment of the present invention, the TFE structure may have a triple-layered structure. However, the structure of the TFE structure is not limited thereto. For example, the TFE structure may have 5-layered structure including the first through fifth TFE layers or 7-layered structure including the first through seventh TFE layers.

Figure 5B:
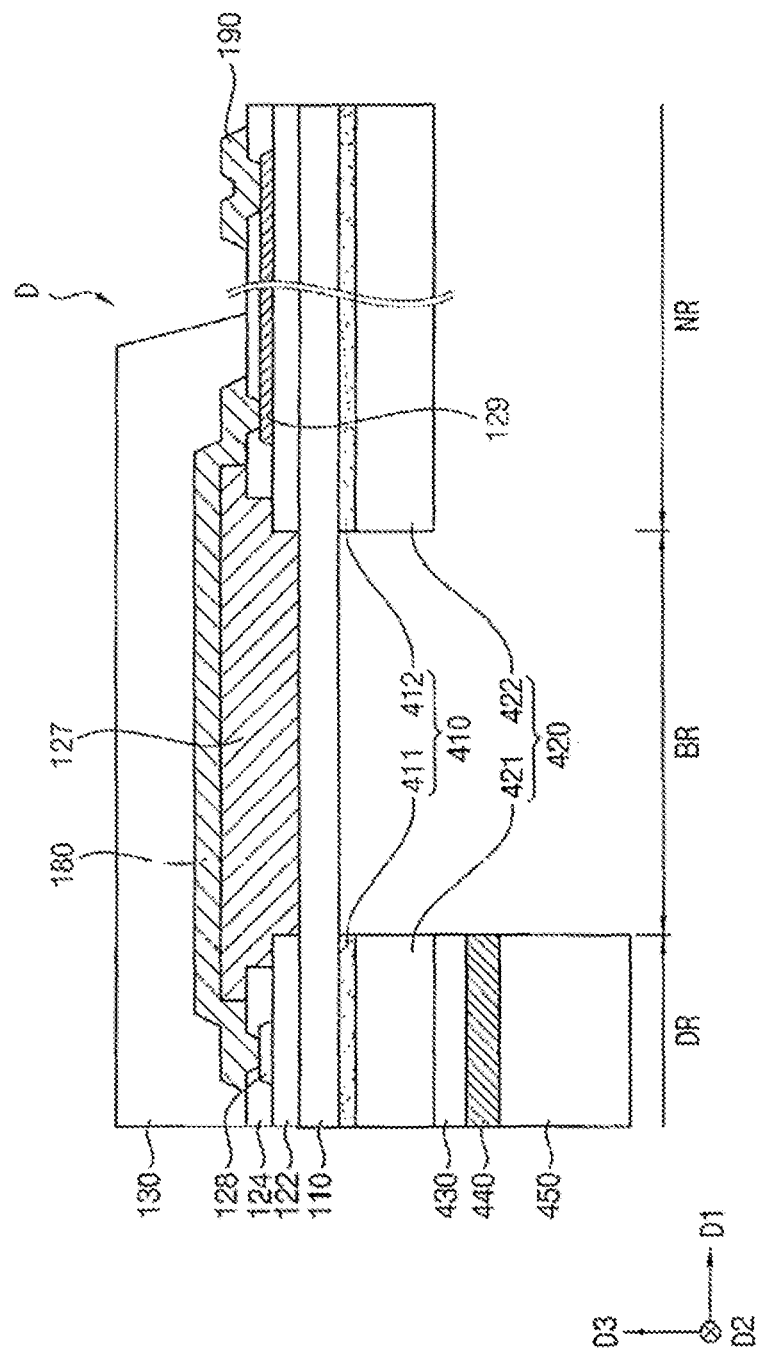
FIG. 5B is an enlarged cross-sectional view illustrating another example of part 'D' of FIG. 2.

FIG. 5B is an enlarged cross-sectional view illustrating another example of part 'D' of FIG. 2.

Referring to FIGS. 4 and 5B, the driving circuit (or the external device) may provide the data signal, the scan signal, the emission control signal, or the power voltage to the pixels via the second conductive pattern 129, the connection wiring 180, and the first conductive pattern 128. The connection structure of the display device according to an exemplary embodiment of the present invention described with reference to FIG. 5B may be substantially the same as the connection structure of the exemplary embodiment described wherein reference to FIG. 5A, except that a first insulation layer 127 may be positioned between the substrate 110 and the connection wiring 180 on the bending region BR. Thus, the same reference numerals may be used to refer to the same or like parts as those described with reference to FIG. 5A, and duplicative descriptions may be omitted.

The first insulation layer 127 may be disposed on the substrate 110 in the bending region BR. The first conductive pattern 128 may be disposed on the first insulation layer 127 in the bending region BR.

In an exemplary embodiment of the present invention, the first insulation layer 127 may have a substantially level upper surface, and a planarization process may be further performed on the first insulation layer 127 to implement the level surface of the first insulation layer 127. For example, the thickness of the first insulating layer 127 may be adjusted such that the neutral plane in the bending region BR is located at a position in which the connection wiring 180 is located. Thus, an occurrence of damage to the connection wiring 180 may be reduced or eliminated and the durability of the connection wiring 180 may be increased.

In an exemplary embodiment of the present invention, the first insulation layer 127 may have an uneven surface on at least a portion of the upper surface. Thus, the connection wiring 180 disposed on the first insulation layer 127 may have upper and/or lower surface corresponding to the uneven surface of the first insulating layer 127. Tensile stress may be applied to the connection wiring 180 in the bending region BR as the substrate 110 is bent in the bending region BR. The amount of tensile stress applied to the connection wiring 180 may be reduced when the connection wiring 180 has the uneven upper and/or lower surfaces corresponding to the uneven surface of the layer 127. As an example, the tensile stress occurred by bending of the display panel can be reduced by deforming the shape of the first insulating layer 127 having a relatively low strength. The connection wiring 180 may have an uneven surface before the substrate is bent, and the connection wiring 180 may have a shape corresponding to the first insulating layer 127 of which shape is deformed by the bending after the substrate is bent. Thus, an occurrence of a short circuit in the connection wiring 180 may be reduced or eliminated.

Although the exemplary embodiments of the present invention described with reference to FIGS. 5A and 5B describe that the pixels and the driving circuit (or, the external devices) are electrically connected through the first conductive pattern 128 and the second conductive pattern 129, exemplary embodiments of the present invention are not limited thereto. For example, the driving circuit (or the external device) may be electrically connected to the connection wiring through the pad wiring directly in direct contact with the connection wiring. Each of the connection wirings may be directly connected to one of the scan signal lines, the data signal lines, the emission control signal lines, or the power supply lines.

Although the exemplary embodiments of the present invention described with reference to FIGS. 5A and 5B describe that the planarization layer 130 substantially covers the connection wiring 180 in the bending region BR and the pad region NR, exemplary embodiments of the present invention are not limited thereto. The connection wiring 180 may be exposed or the connection wiring 180 may be substantially covered by at least one of the planarization layer 130, the pixel defining layer 150, or a bending protection layer. For example, the bending protection layer may be disposed on the planarization layer 130 in a portion of the bending region BR and the pad region NR. Thus, the thickness of the bending protection layer can be determined such that the neutral plane in the bending region BR is positioned at the portion where the connection wirings 180 are disposed. For example, when the neutral plane of the bending region BR is located at the portion where the connection wirings 180 are disposed, the bending stress applied to the connection wirings 180 by bending the bending region BR may be reduced. Thus, the connection wirings 180 might not be broken.

Although the exemplary embodiments of the present invention described with reference to FIGS. 5A and 5B describe that the connection wiring 180 includes notches in the bending region BR and/or the pad region NR, the connection wiring 180 may also include notches in the display region DR. For example, the connection wiring 180 may include notches in the display region DR and the pad region NR, and may include both holes and notches in the bending region BR.

Figure 7:
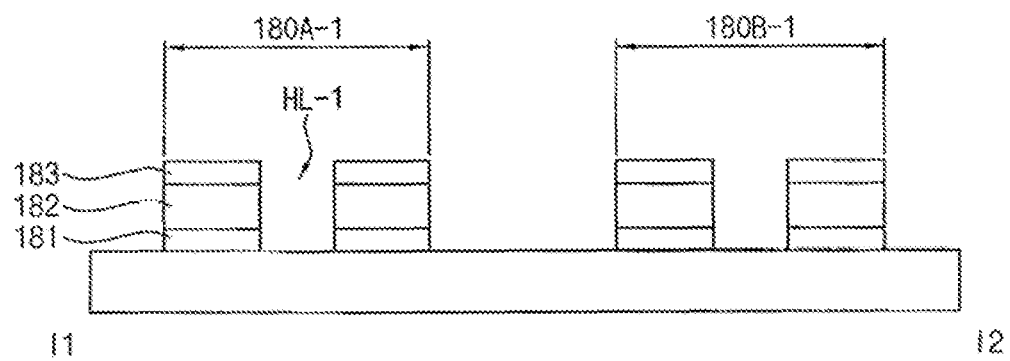
FIG. 7 is a cross-sectional view cut along a line I-I' of FIG. 6.

FIG. 6 is an enlarged plan view illustrating an example of part 'A' of FIG. 1. FIG. 7 is a cross-sectional view cut along a line I-I' of FIG. 6.

Referring to FIGS. 6 and 7, each of connection wirings 180A-1, 180B-1 may include holes HL-1 and notches NT-1 on at least a portion A-1 of the bending region, thus reducing or preventing an occurrence of a short circuit between adjacent wirings the bending region BR during a manufacturing process.

Referring to FIG. 7, each of the connection wirings 180A-1, 180B-1 may include a first metal layer 181, a second metal layer 182, and a third metal layer 183. For example, the first metal layer 181, the second metal layer 182 and the third metal layer 183 may have a triple-layered structure including titanium/aluminum/titanium (Ti/Al/Ti) layers or including molybdenum/aluminum/molybdenum (Mo/AL/Mo). In this case, because the connection wirings 180A-1, 180B-1 may be formed by a dry etching process with high precision, the interval between the connection wirings can be shortened. Thus, it is possible to arrange a relatively large number of wirings in a relatively narrow space, and a high resolution display device can be implemented.

In this case, the third metal layer 183 including titanium (Ti) or molybdenum (Mo) may be damaged during the manufacturing process due to the etching process, the cleaning process, or other impacts. For example, when the driving circuit is mounted in the COP manner, the connection wirings 180A-1, 180B-1 in the bending area BR may be exposed without capping to prevent contact lifting. Thus, the short circuit between adjacent connection wirings 180A-1, 180B-1 may occur as a result of interaction between particles (for example, titanium (Ti) particles) of adjacent connection wirings 180A-1, 180B-1. Thus, each of the connection wirings 180A-1, 180B-1 may include notches NT-1 to avoid relatively long arrangements of particles in a straight line.

Referring to FIG. 6, each of the connection wirings 180A-1, 180B-1 may include notches NT-1 at the first side and the second side opposite the first side in the bending region BR. In an exemplary embodiment of the present invention, the notches NT-1 may be arranged at regular intervals along the first direction D1. A first distance D1-1 between the two adjacent notches NT-1 may be smaller than the second distance D2-1 between the two adjacent connection wirings 180A-1, 180B-1. Here, the first distance D1-1 indicates a length of the straight portion of the connection wiring, the straight portion defined by the notch NT-1. The second distance D2-1 indicates the shortest distance between the two adjacent connection wirings 180A-1, 180B-1. Thus, the notches NT-1 may be formed such that the first distance D1-1 between the notches NT-1 is relatively short compared to the second distance D2-1 between the connection wirings 180A-1, 180B-1. Thus, relatively long and straight arrangements of particles might not be generated because the connection wirings 180A-1, 180B-1 extending in the first direction D1 do not have a long straight-line shape on the bending region BR.

Each of the connection wirings 180A-1 and 180B-1 may include holes HL-1 in the bending region BR, which may increase the flexibility. The holes HL-1 may penetrate the connection wiring in the vertical direction (e.g., a third direction D3), and may be arranged at regular intervals with respect to the first direction D1. In an exemplary embodiment of the present invention, a first size S1 (or a first length) of each of the holes HL-1 may be smaller than the second distance D2-1. Here, the first size S1 of the hole HL-1 indicates the longest length of the hole in the plane view. In an exemplary embodiment of the present invention, the holes HL-1 may have a substantially circular shape, and the first size S1 of the holes HL-1 may correspond to the diameter of the holes HL-1. In an exemplary embodiment of the present invention, the holes HL-1 may have an elliptical shape, and the first size S1 of the holes HL-1 may correspond to the long diameter of the holes HL-1. In an exemplary embodiment of the present invention, the holes HL-1 have a polygonal shape, and the first size S1 of the holes HL-1 may correspond to the longest one of the diagonal lines of the polygon. Thus, an occurrence of a short circuit between the connection wirings 180A-1 and 180B-1 as a result of particles generated in the process of forming the holes can be prevented.

Although the exemplary embodiments of the present invention described with reference to FIG. 7 describe that each of the connection wirings 180A-1, 180B-1 has a triple-layered structure, a structure of the connection wiring is not limited thereto. For example, each of the connection wirings may have a single-layered structure or a multi-layered structure, which may include at least one of aluminum (Al), platinum (Pt), palladium (Pd), silver (Ag), magnesium (Mg), gold (Au), nickel (Ni), neodymium (Nd), iridium (Ir), chrome (Cr), nickel (Ni), molybdenum (Mo), titanium (Ti), tungsten (W), or copper (Cu).

FIGS. 8 through 12 are enlarged plan views illustrating examples of part 'A' of FIG. 1.

Referring to FIGS. 8 through 12, holes and notches of connection wirings on the bending region may be formed in various ways according to characteristics and arrangements of the connection wirings.

Figure 8:
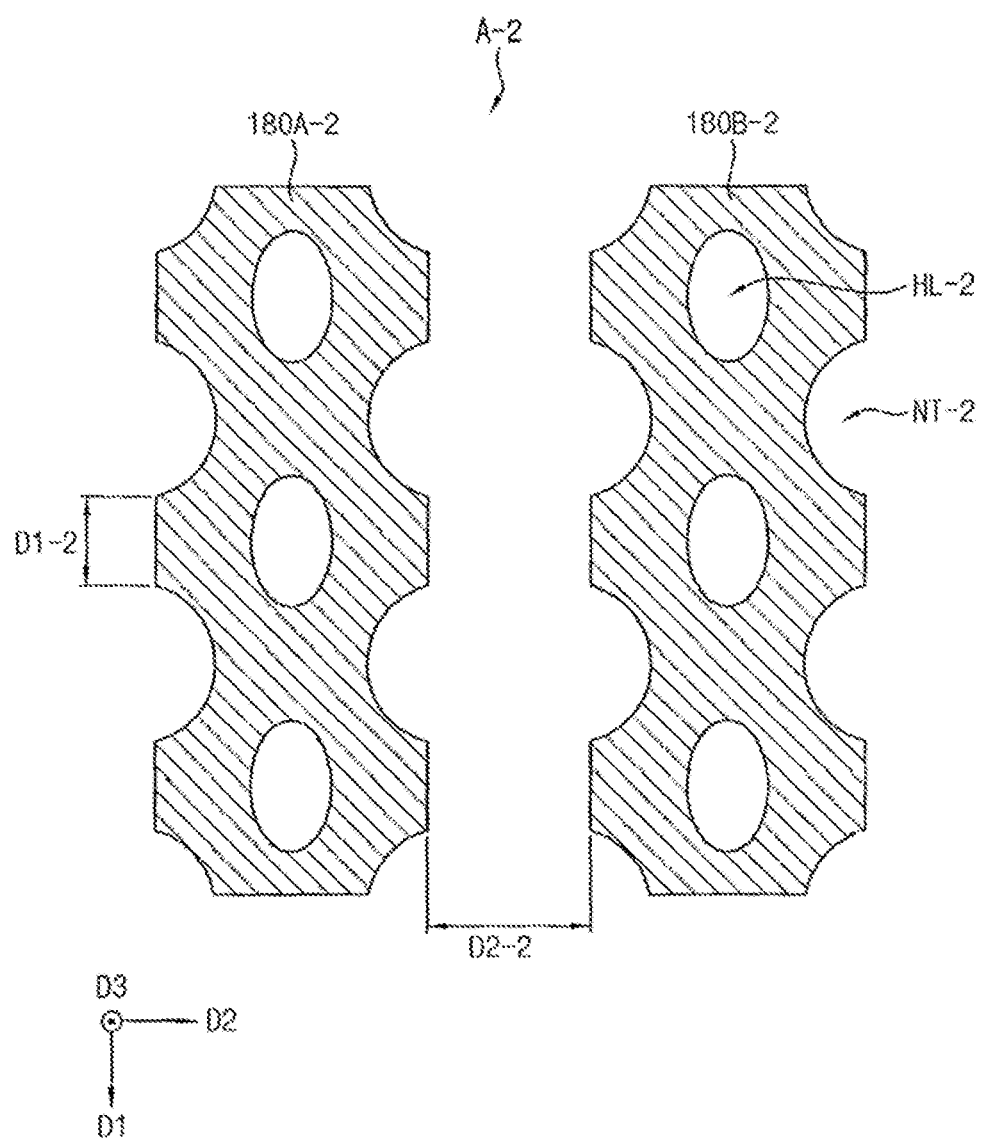
FIGS. 8 through 12 are enlarged plan views illustrating examples of part 'A' of FIG. 1.

Referring to FIG. 8, each of connection wirings 180A-2, 180B-2 may include holes HL-2 having an elliptical shape and notches NT-2 having a semicircular shape in at least portion A-2 of the bending region. The notches NT-2 may be arranged at regular intervals along the first direction D1. A first distance D1-2 between two adjacent notches NT-2 may be smaller than the second distance D2-2 between two adjacent connection wirings 180A-2, 180B-2. The holes HL-2 may be positioned at approximately the center of the connection wiring with respect to the second direction D2 in a plan view. The holes HL-2 may penetrate the connection wiring in the vertical direction (e.g., the third direction D3) and may be arranged at regular intervals with respect to the first direction D1. The size (e.g., length or diameter) of the hole HL-2 may be smaller than a second distance D2-2.

As an example, in case that the line width of the connection wiring 180A-2, 180B-2 is decreased by the notch NT-2, a resistance of the connection wiring 180A-2, 180B-2 may be increased. The resistance of the connection wirings 180A-2, 180B-2 may be increased when the line width is relatively uneven in comparison with the case in which the line width is relatively even. Thus, to increase the uniformity of the line width determined by the holes HL-2 and notches NT-2 and to decrease the declined degree of the line width determined by the notch NT-2, the notches NT-2 may have a semicircular shape, and the notches NT-2 and the holes HL-2 may be alternately arranged along the first direction D1. Thus, the resistance of the connection wiring 180A-2, 180B-2 might not be increased, and the efficiency of electrical signal transmission may be increased.

Figure 9:
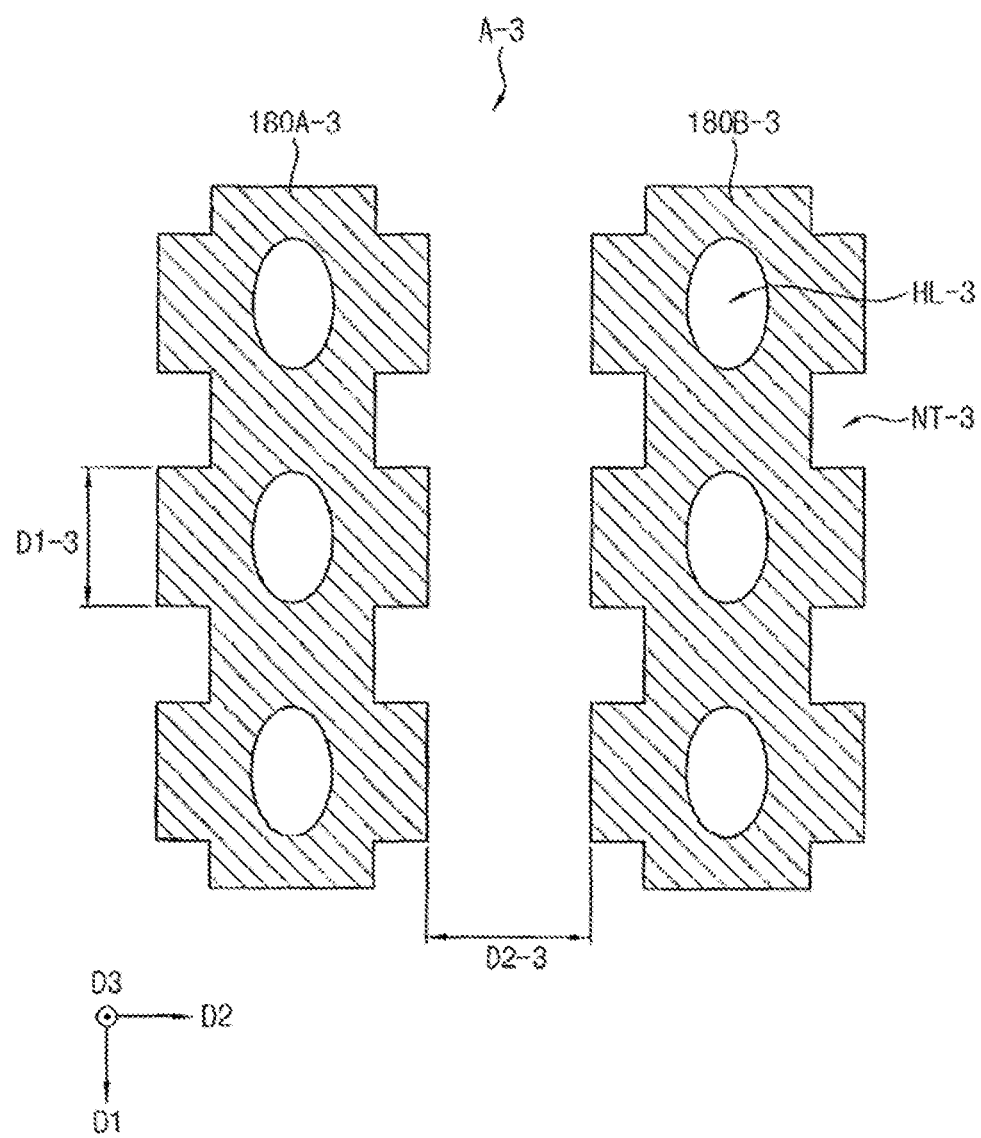

Referring to FIG. 9, each of connection wirings 180A-3, 180B-3 may include holes HL-3 having an elliptical shape and notches NT-3 having a substantially rectangular shape in at least portion A-3 of the bending region. The notches NT-3 may be arranged at regular intervals along the first direction D1. A first distance D1-3 between two adjacent notches NT-3 may be smaller than a second distance D2-3 between two adjacent connection wirings 180A-3, 180B-3. The holes HL-3 may be positioned at approximately the center of the connection wiring with respect to the second direction D2 in a plan view. The holes HL-3 may penetrate the connection wiring in the vertical direction (e.g., the third direction D3) and may be arranged at regular intervals along the first direction D1. The size (e.g., length or diameter) of the hole HL-3 may be smaller than the second distance D2-3.

As an example, a resistance of the connection wiring 180A-3, 180B-3 may be decreased by positioning the notch NT-3 relatively far from the hole HL-3. Thus, the connection wiring 180A-3, 180B-3 in the bending region BR may extend in the first direction D1, and then the holes HL-3 need not overlap the notches NT-3 having a substantially rectangular shape with respect to the second direction D2 perpendicular to the first direction D1 in the plan view. Thus, the minimum distance between the notch NT-3 and the hole HL-3 may be formed without a portion in which the line width is narrowed. Thus decreasing the resistance of the connection wirings 180A-3 180B-3. Thus, to increase the uniformity of the line width determined by the holes HL-3 and notches NT-3 and to decrease the declined degree of the line width determined by the notch NT-3, the notches NT-3 may have the substantially rectangular shape, and the notches NT-3 and the holes HL-3 may be alternately arranged along the first direction D1. Thus, the resistance of the connection wiring 180A-3, 180B-3 might not be increased, and the efficiency of electrical signal transmission may be increased.

Figure 10:
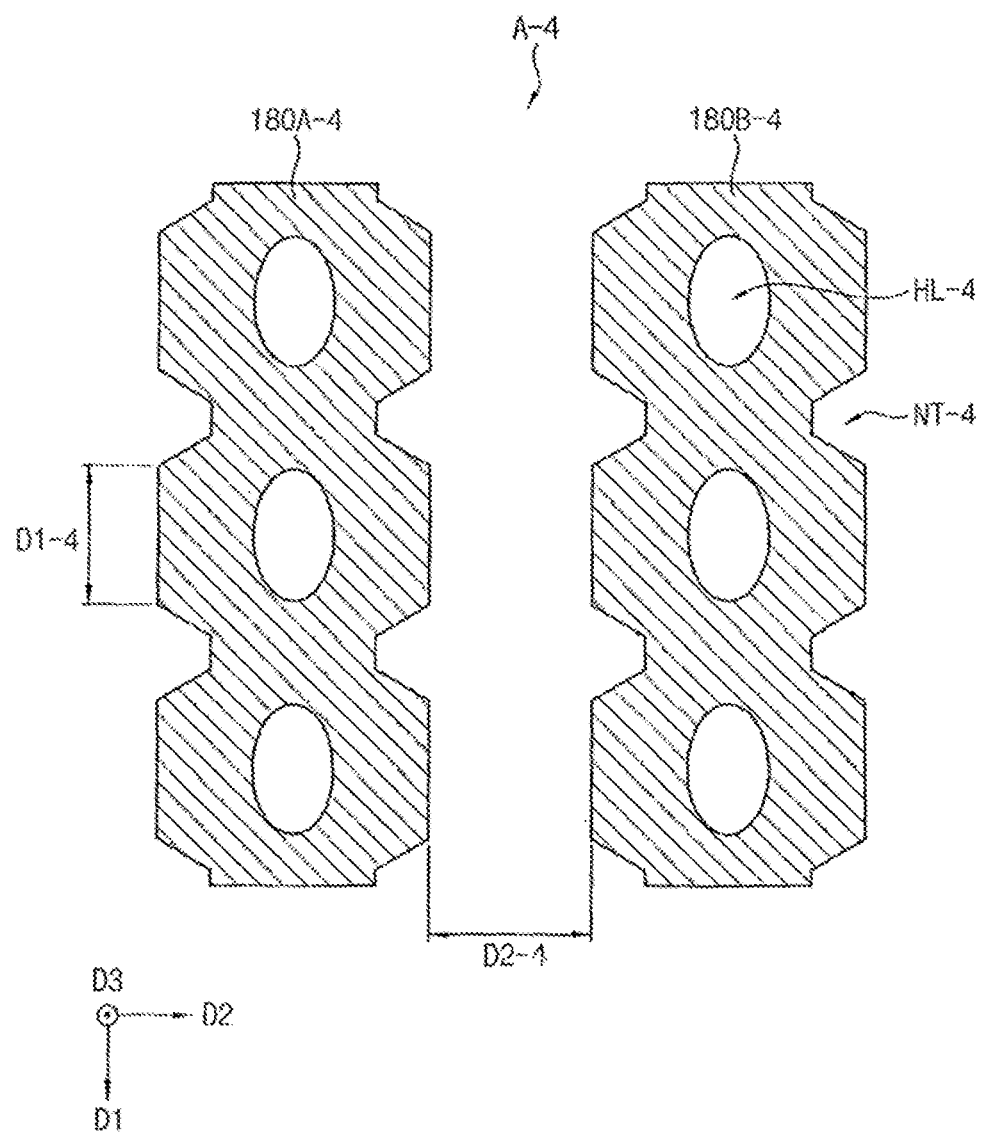

Referring to FIG. 10, each of connection wirings 180A-4, 180B-4 may include holes HL-4 having an elliptical shape and notches NT-4 having a trapezoidal shape in at least portion A-4 of the bending region. The notches NT-4 may be arranged at regular intervals along the first direction D1. A first distance D1-4 between two adjacent notches NT-4 may be smaller than a second distance D2-4 between two adjacent connection wirings 180A-4, 180B-4. The holes HL-4 may be positioned at substantially the center of the connection wiring with respect to the second direction D2 in a plan view. The holes HL-4 may penetrate the connection wiring in the vertical direction (e.g., the third direction D3) and may be arranged at regular intervals along the first direction D1. The size (e.g., length or diameter) of the hole HL-4 may be smaller than the second distance D2-4.

To increase the uniformity of the line width determined according to the holes HL-4 and notches NT-4 and to decrease the declined degree of the line width according to the notch NT-4, the notches NT-4 may have the trapezoidal shape, and the notches NT-4 and the holes HL-4 may be alternately arranged along the first direction D1. Thus, the connection wiring 180A-4, 180B-4 according to an exemplary embodiment of the present invention may increase the uniformity of the line width compared to the connection wiring 180A-3, 18B-3 described with reference to FIG. 9 including the notches NT-3 having the substantially rectangular shape because the connection wiring 180A-4, 180B-4 on the bending region BR includes the notches NT-4 having the trapezoidal shape. In addition, the connection wiring 180A-4, 180B-4 in the bending region BR may extend in the first direction D1, and the holes HL-4 need not overlap the notches NT-4 having the trapezoidal shape with respect to the second direction D2 perpendicular to the first direction D1 in a plan view.

Figure 11:
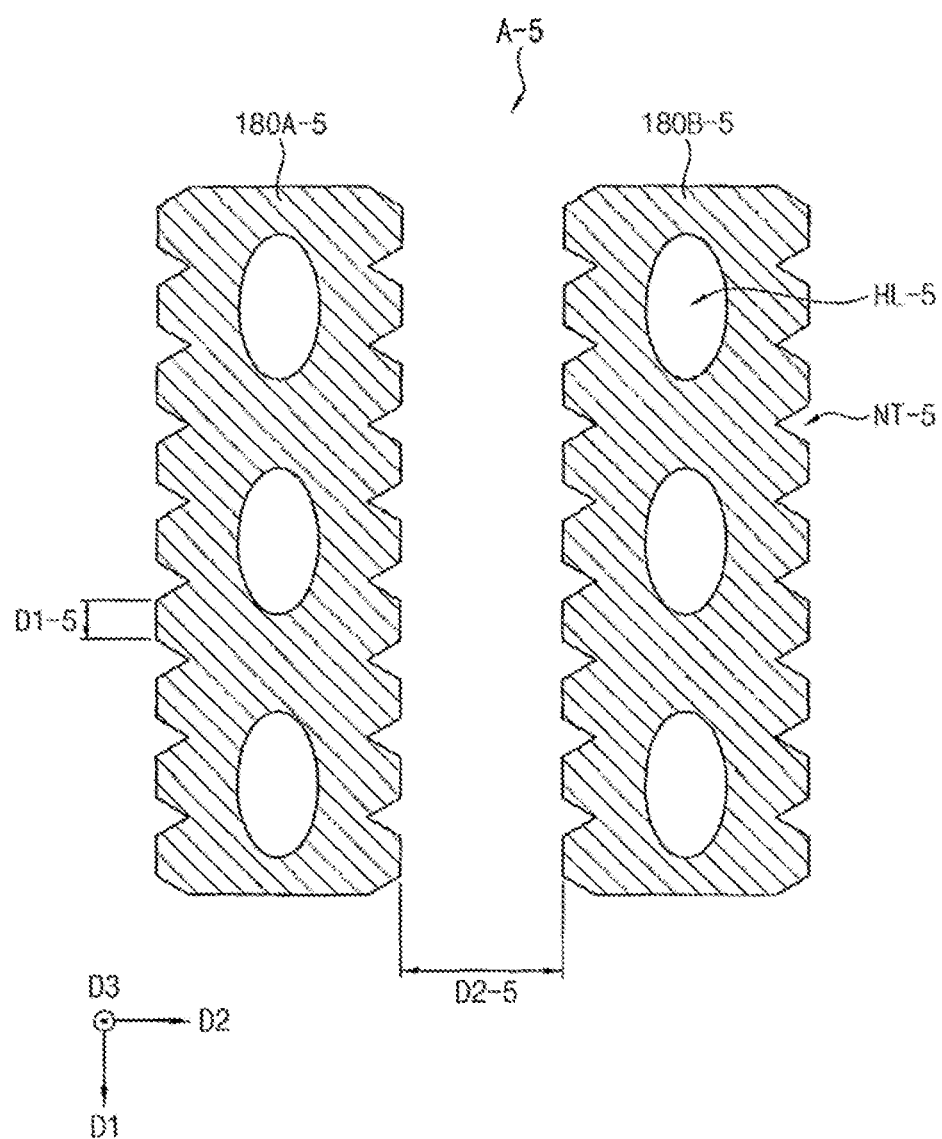
Figure 12:
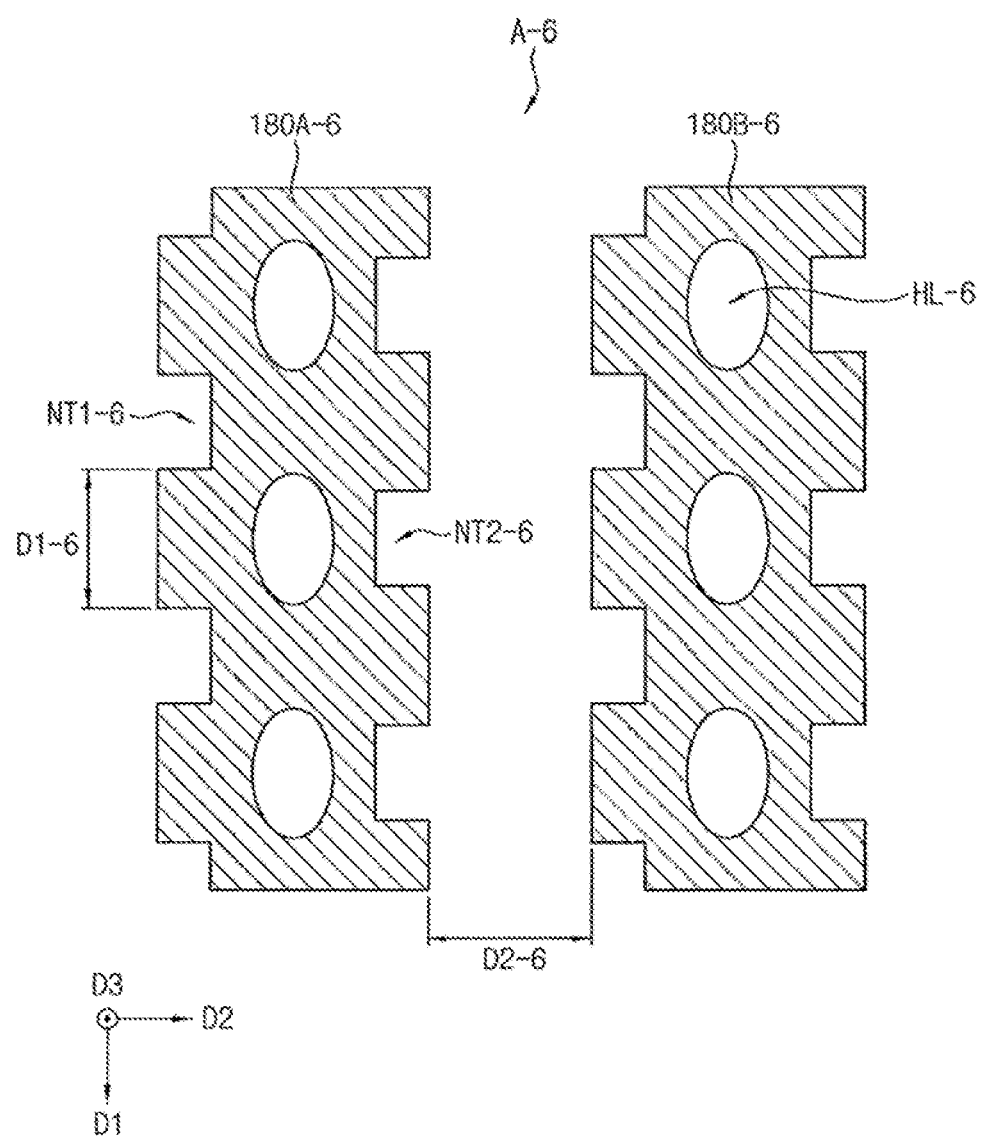

Referring to FIG. 11, each of connection wirings 180A-5, 180B-5 may include holes HL-5 having an elliptical shape and notches NT-5 having a triangular shape in at least portion A-5 of the bending region. The notches NT-5 may be arranged at regular intervals along the first direction D1. A first distance D1-5 between two adjacent notches NT-5 may be smaller than a second distance D2-5 between two adjacent connection wirings 180A-5, 180B-5. The holes HL-5 may be positioned at substantially the center of the connection wiring with respect to the second direction D2 in a plan view. The holes HL-5 may penetrate the connection wiring in the vertical direction (e.g., the third direction D3) and may be arranged at regular intervals along the first direction D1. The size (e.g., length or diameter) of the hole HL-5 may be smaller than the second distance D2-5.

The connection wiring 180A-5, 180B-5 according to an exemplary embodiment of the present invention (e.g., an exemplary embodiment described with reference to FIG. 1) may include notches, which arranged at relatively short intervals, of which sizes are relatively small compared to the connection wiring 180A-1, 180B-1 described with reference to FIG. 6. For example, two notches NT-5 may be arranged on opposite sides of one hole HL-5 along the second direction D2. In this case, the efficiency of electrical signal transmission can be increased because the line width may be relatively large.

Although the exemplary embodiments of the present invention described with reference to FIGS. 6 through 11 describe that notches located at the first side and notches located at the second side of the connection wiring on the bending region are substantially symmetrical to each other with respect to the first direction in which the connection wirings extend, the arrangement of the notches is not limited thereto. For example, referring to FIG. 12, the connection wirings 180A-6, 180B-6 may include holes HL-6 having the elliptical shape, a plurality of first notches NT1-6 located at the first side of the connection wiring, and a plurality of second notches NT2-6 located at the second side of the connection wiring 180A-6, 180B-6. The first notches NT1-6 need not overlap the second notches NT2-6 along the second direction D2 perpendicular to the first direction D1 in the plan view. A first distance D1-6 between two adjacent first notches NT1-6 (or between two adjacent second notches NT2-6) may be smaller than a second distance D2-6 between two adjacent connection wirings 180A-6, 180B-6.

Although the exemplary embodiments of the present invention described with reference to FIGS. 6 through 12 describe that notches have at least one of the triangular shape, the rectangular shape, the trapezoidal shape, or the semicircular shape in the plan view, the shapes of the notches are not limited thereto. For example, the notches may have other polygonal shapes. For example, the first notches located at the first side and the second notches located at the second side of the connection wiring may have different shapes.

Although the exemplary embodiments of the present invention described with reference to FIGS. 6 through 12 describe that the holes have the elliptical shape on the bending region BR, the shape of the hole is not limited thereto. For example, the holes may have a substantially circular shape or a polygonal shape.

Although the exemplary embodiments of the present invention described with reference to FIGS. 6 through 12 describe that the holes penetrate the connection wiring, it is not limited thereto. For example, the connection wiring may include an uneven (e.g., rugged or rough) upper surface.

FIGS. 13 through 18 are enlarged plan views illustrating examples of part 'B' of FIG. 1.

Referring to FIGS. 13 through 18, notches of pad wirings on the pad region may be formed in various ways according to characteristics and arrangements of the pad wirings. Thus, because the pad wirings need not be covered by an organic layer during the manufacturing process, each of the pad wirings may include notches on at least a portion of the pad region such that relatively long arrangement of particles in a straight line are not generated during or after a manufacturing process.

Figure 13:
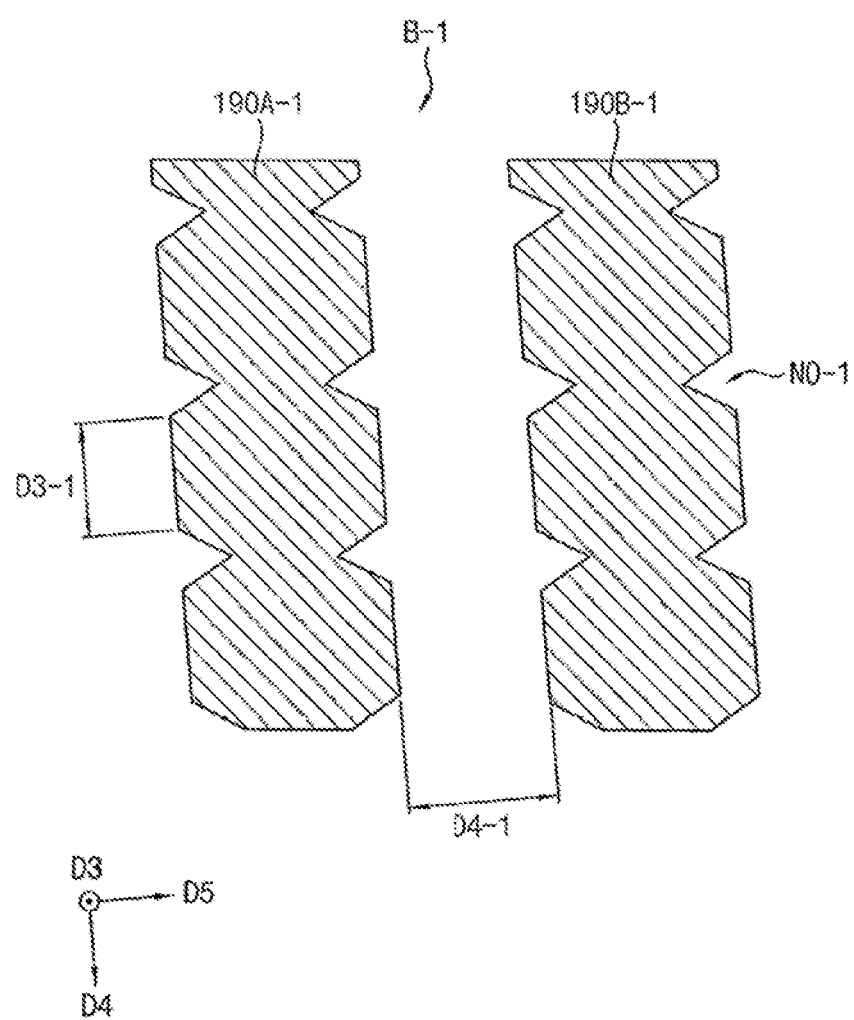
FIGS. 13 through 18 are enlarged plan views illustrating examples of part 'B' of FIG. 1.

Referring to FIG. 13, each of pad wirings 190A-1, 190B-1 may include notches NO-1 having a triangular shape in at least portion B-2 of the pad region. The notches NO-1 may be arranged at regular intervals along a fourth direction D4 in which the pad wirings 190A-1, 190B-1 in the pad region NR extend. A third distance D3-1 between two adjacent notches NO-1 may be smaller than a fourth distance D4-1 between two adjacent pad wirings 190A-1, 190B-1.

Figure 14:
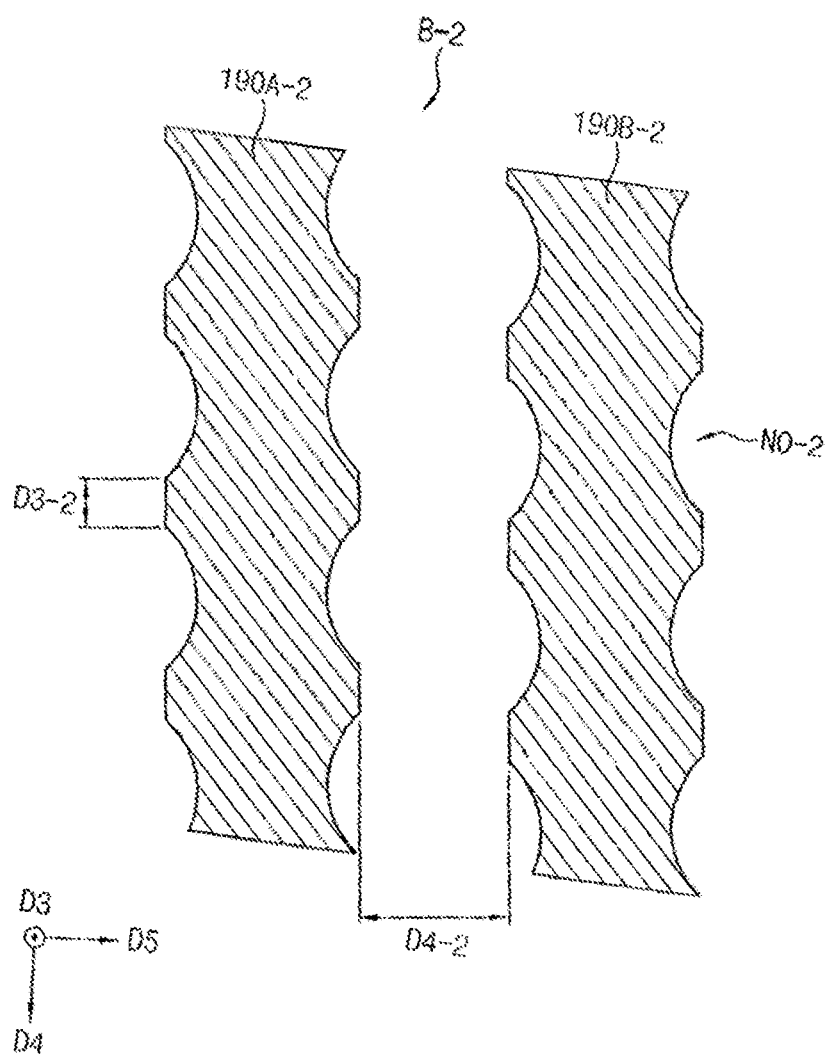

Referring to FIG. 14, each of pad wirings 190A-2, 190B-2 may include notches NO-2 having a semicircular shape in at least portion B-2 of the pad region. The notches NO-2 may be arranged at regular intervals along the fourth direction D4. A third distance D3-2 between two adjacent notches NO-2 may be smaller than a fourth distance D4-2 between two adjacent pad wirings 190A-2, 190B-2.

As an example, when the line width of the pad wiring 190A-2, 190B-2 is decreased by the notch NO-2, a resistance of the pad wiring 190A-2, 19B-2 may be increased. In addition, the resistance of the pad wirings 190A-2, 190B-2 may be increased when the line width is relatively uneven in comparison with the case in which the line width is relatively even. Thus, to increase the uniformity of the line width and to decrease the declined degree of the line width according to the notch NO-2, the notches NO-2 may have a semicircular shape. Thus, the efficiency of electrical signal transmission may be increased.

Figure 15:
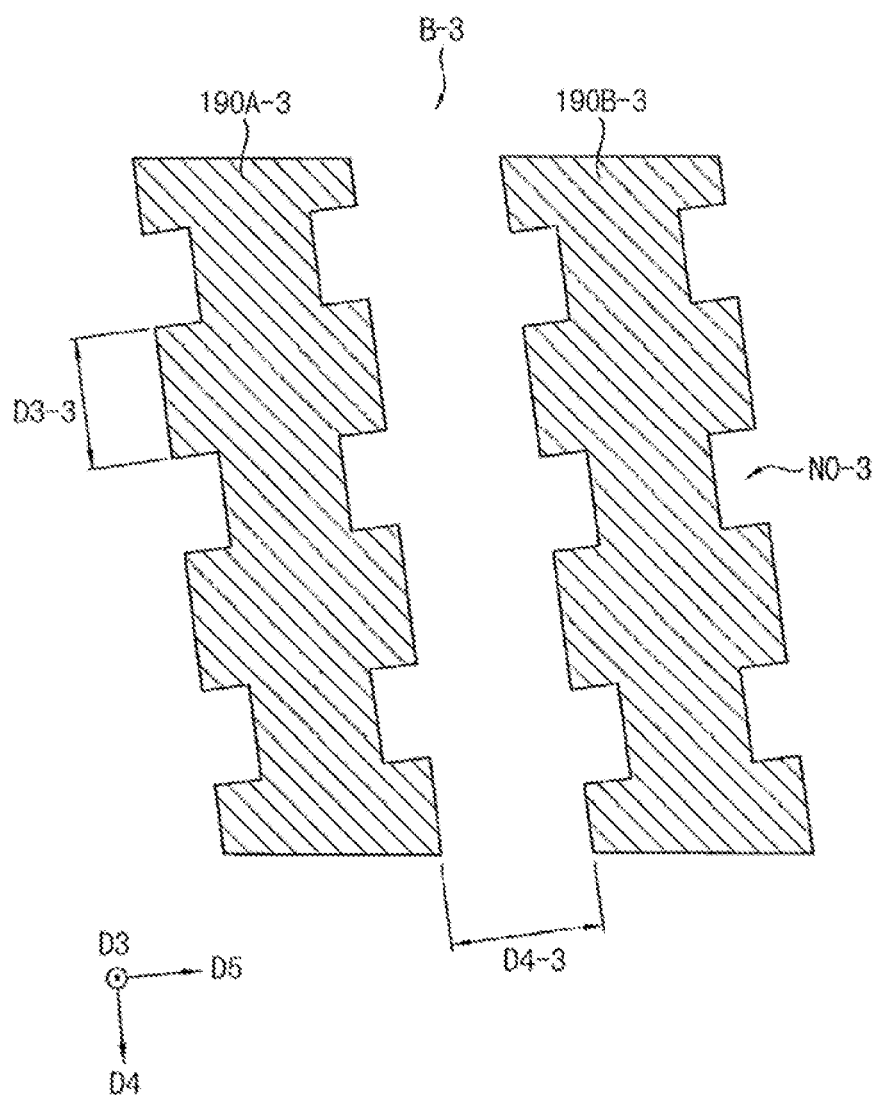
Figure 16:
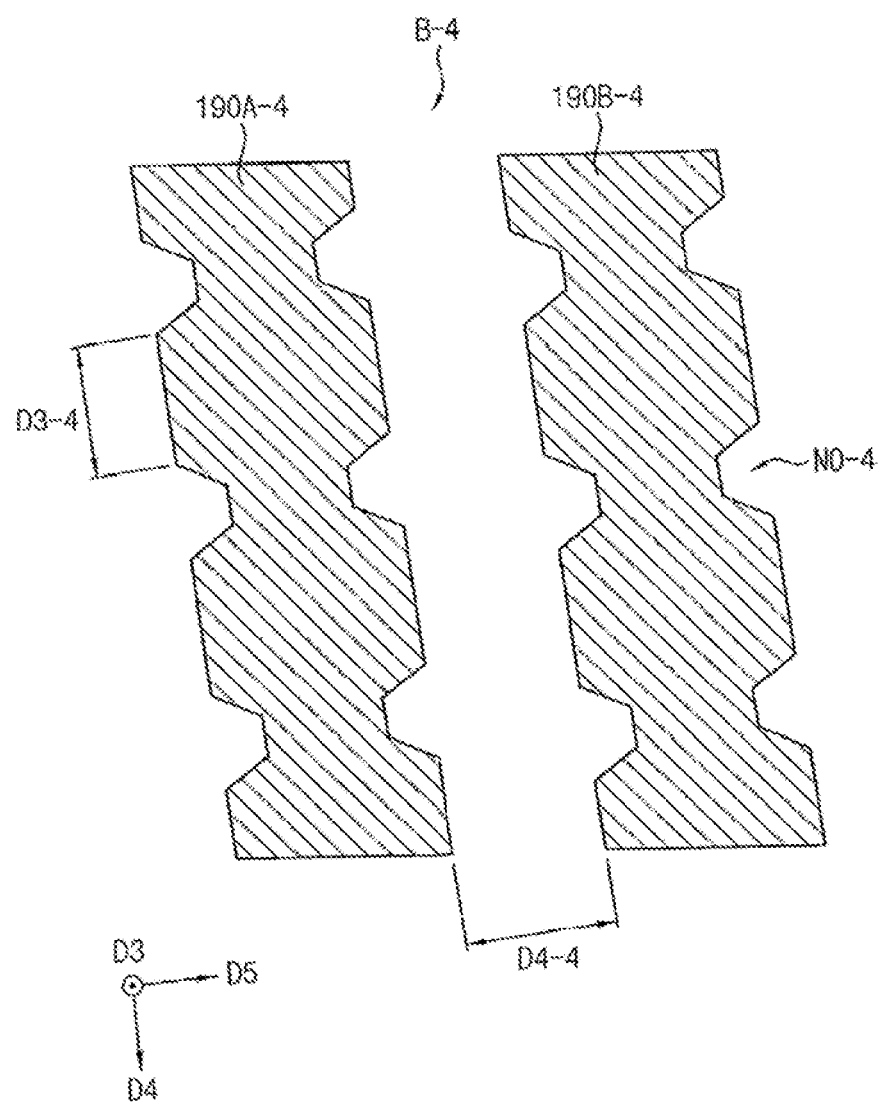

Referring to FIGS. 15 and 16, similar to the bending region BR, each of pad wirings 190A-3, 190B-3 may include notches NO-3 having a rectangular shape in at least portion B-3 of the pad region, or each of the pad wirings 190A-4, 190-4 may include notches NO-4 having a trapezoidal shape in at least portion B-4 of the pad region. A third distance D3-3 (or D3-4) between two adjacent notches NO-3 (or NO-4) may be smaller than a fourth distance D4-3 (or D4-4) between two adjacent pad wirings.

Figure 17:
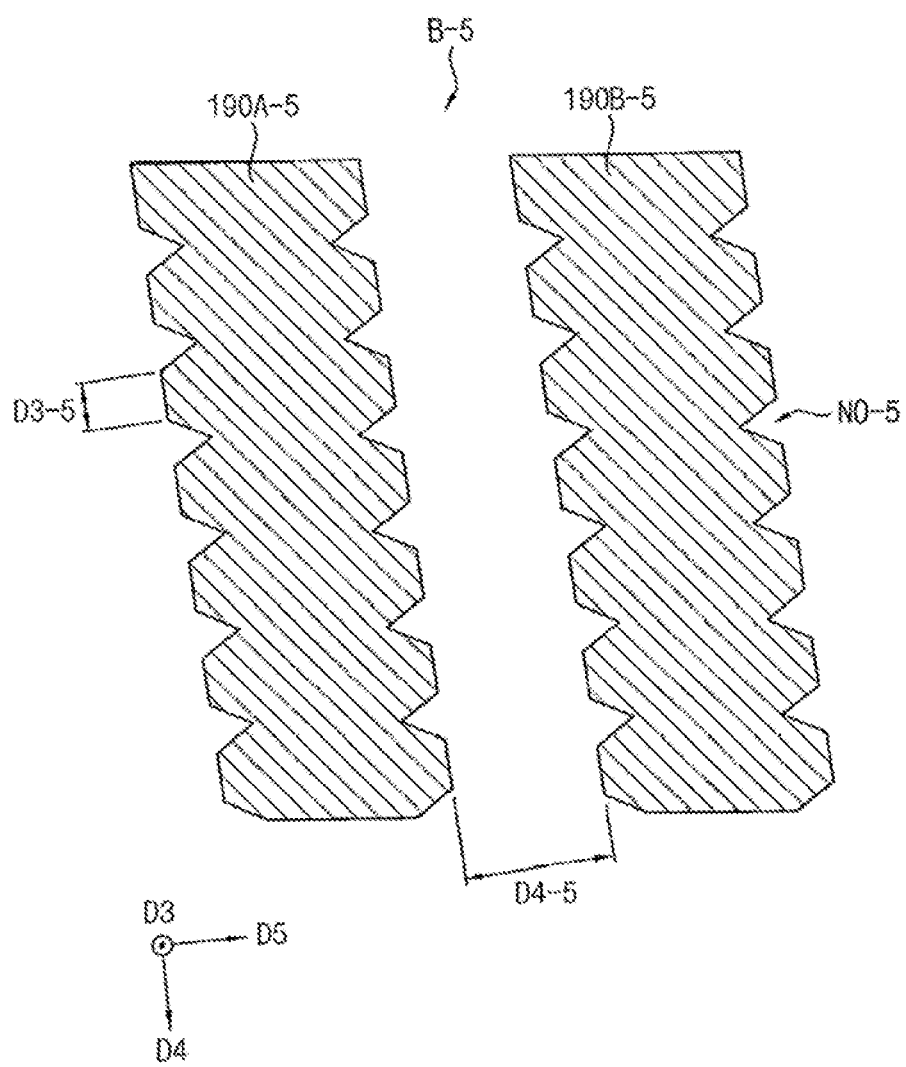
Figure 18:
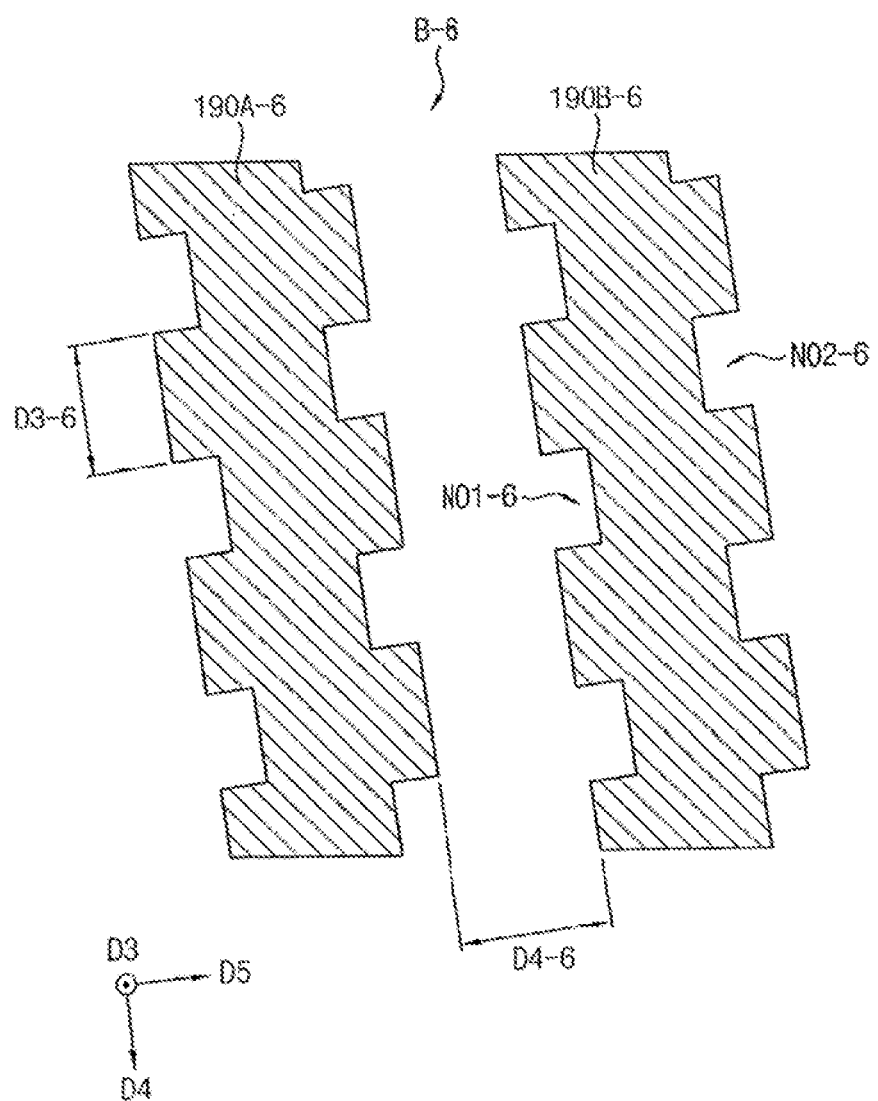

Referring to FIG. 17, each of pad wirings 190A-5, 190B-5 may include notches NO-5 having a triangular shape in at least portion B-5 of the pad region. A third distance D3-5 between two adjacent notches NO-5 may be smaller than a fourth distance D4-5 between two adjacent pad wirings 190A-5, 190B-5. The pad wiring 190A-5, 190B-5 according to an exemplary embodiment of the present invention described with reference to FIG. 17 may include the notches, which arranged at relatively short intervals, of which sizes are relatively small compared to the pad wiring 190A-1, 190B-1 described with reference to FIG. 13. Thus, the pad wirings 190A-5, 190B-5 described with reference to FIG. 17 may have a relatively large line width in comparison with the pad wiring 190A-1, 190B-1 described with reference to FIG. 13, thus increasing the efficiency of electrical signal transmission.

Although the exemplary embodiments of the present invention described with reference to FIGS. 13 through 17 describe that notches positioned at the first side and notches located at the second side of the pad wiring on the pad region NR are symmetrical to each other with respect to the fourth direction D4 in which the pad wiring extends, the arrangement of the notches is not limited thereto. For example, referring to FIG. 18, pad wirings 190A-6, 190B-6 may include a plurality of third notches NO1-6 positioned at the first side and a plurality of second notches positioned at the second side on at least a portion B-6 of pad region. The third notches NO1-6 need not overlap fourth notches NO2-6 along a fifth direction D5 orthogonal to the fourth direction D4 in a plan view. A third distance D3-6 between two adjacent third notches NO1-6 (or between two adjacent fourth notches NO2-6) may be smaller than a fourth distance 14-6 between two adjacent pad wirings 190A-6, 190B-6.

Although the exemplary embodiments of the present invention described with reference to FIGS. 13 through 17 describe that notches of pad wirings have at least one shape of the triangular shape, the rectangular shape, the trapezoidal shape, and the semicircular shape in the plan view, shapes of the notches are not limited thereto. For example, the notches may have other polygonal shapes. As an example, notches located at the first side of the pad wiring and notches located at the second side of the pad wiring may have different shapes.

Although the exemplary embodiments of the present invention described with reference to FIGS. 13 through 17 describe that notches are arranged at regular intervals in the pad region NR, the arrangement of the notches is not limited thereto. In an exemplary embodiment of the present invention, the notches on the pad region NR may be arranged such that a distance between two adjacent notches increases as a distance away from the bending region BR increases.

Figure 19:
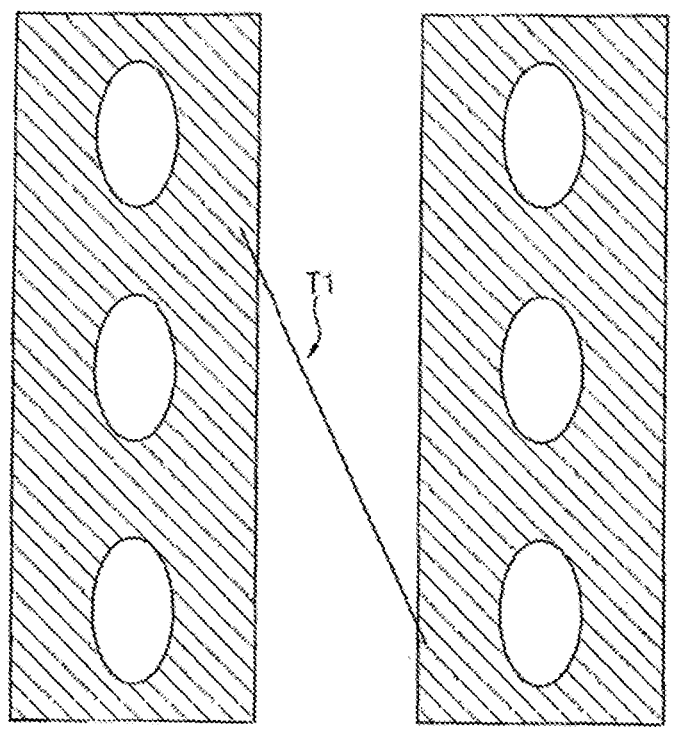
FIGS. 19 through 20 are views for describing an effect of the display device of FIG. 1.
Figure 20:
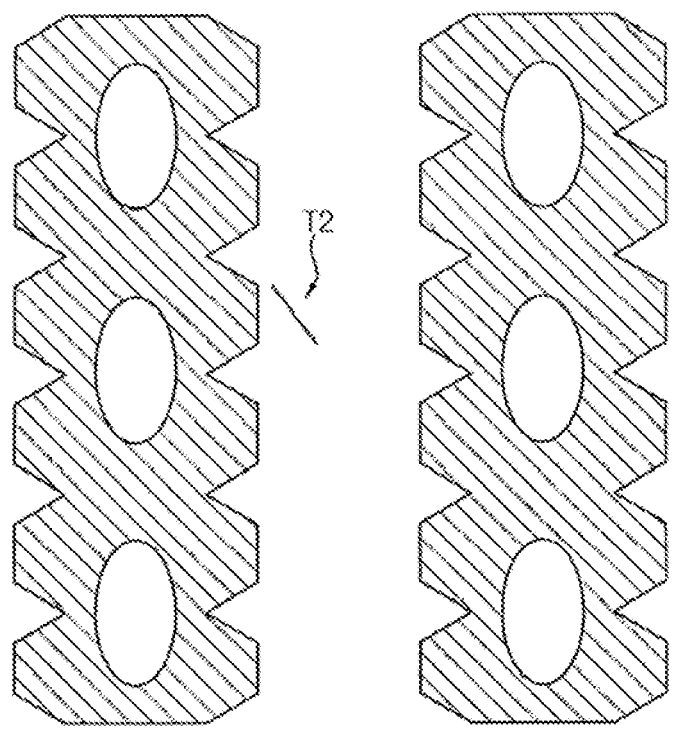

FIGS. 19 through 20 are views for describing an effect of the display device of FIG. 1.

Referring to FIGS. 19 through 20, notches may be formed in the connection wirings on the bending region and the pad region, and an interval between adjacent notches (e.g., a length of a straight portion of wiring) may be smaller than an interval between adjacent wirings, thus reducing or eliminating an occurrence of a short circuit between adjacent wirings on the bending region and the pad region during a manufacturing processes (e.g., processes before the connection wiring is covered with the organic layer).

In an exemplary embodiment of the present invention described with reference to FIG. 19, when both sides of the connection wiring have a straight shape without a notch, a first particle T1, which is longer than a distance between adjacent connection wirings, may be generated during the manufacturing process of the display device. A short circuit between the connection wirings may occur as a result of the first particle T1, and defects of display device may result. For example, in a high resolution display device, a gap between connection wirings may be relatively small, and the defects due to the short circuit may occur in the bending region of the display device.

Referring to FIG. 20, in an exemplary embodiment of the present invention, notches may be formed in the connection wiring on the bending region such that both sides of the connection wiring do not extend in a straight line. In this case, although a second particle T2 may be generated during the manufacturing process of the display device, the length of the second particle T2 may be smaller than the distance between adjacent connection wirings. Thus, an occurrence of a short circuit between the connection wirings may be reduced or eliminated, thus increasing a manufacturing yield of the display device and reducing a manufacturing cost of the display device. For example, when the display device having a quad high definition (Quad HD) resolution is manufactured, the manufacturing yield may be increased by about 0.5%.

Thus, the display device according to an exemplary embodiment of the present invention may prevent a short circuit between adjacent wirings, such as in an exposed portion of wiring which is not covered by the organic layer during the manufacturing process, by forming the notches in the wirings. Although some exemplary embodiments of the present invention may include notches are formed in the connection wirings and/or the pad wirings on the bending region or the pad region, notches may be formed at various locations in which the wiring is not covered with the organic layer or in which a short circuit can occur as a result of an interaction between particles of adjacent wirings during a manufacturing process.

Although the exemplary embodiments of the present invention describe that notches are formed on both sides of each connection wiring and both sides of each pad wiring, the notches may be formed on the connection wirings and/or the pad wirings in various way. For one example, the notches may be formed on some of the connection wirings, and the notches may not be formed on the others of the connection wirings and the pad wirings. For another example, the notches may be formed on some of the pad wirings, and the notches may not be formed on the others of the pad wirings and the connection wirings.

Although the display device according to example embodiments have been described with reference to figures, those skilled in the art will readily appreciate that many modifications are possible in the example embodiments without materially departing from the novel teachings and aspects of the present invention. For example, although the example embodiments describe that the display device may be the OLED device, a type of the display device is not limited thereto. Also, although the example embodiments describe that the driving circuit may be mounted on the substrate in a COP manner, the driving circuit can be mounted in various manners.

Exemplary embodiments of the present invention may be applied to an electronic device having the display device. For example, exemplary embodiments of the present invention may be applied to a computer monitor, a laptop computer, a cellular phone, a smart phone, a smart pad, or a personal digital assistant (PDA).

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a substrate including a display region, a non-display region spaced apart from the display region, and a connection region between the display region and the non-display region;
a plurality of pixel structures positioned in the display region;
a plurality of wirings positioned in the non-display region; and
a plurality of connection wirings electrically connecting the wirings to the pixel structures, the connection wirings including a core structure and a plurality of protrusions that extend from the core structure in the connection region,
wherein the protrusions include a plurality of first protrusions positioned at a first side of the core structure of each of the connection wirings and a plurality of second protrusions positioned at a second side of the core structure of each of the connection wirings, the second side opposite to the first side,
wherein the first protrusions and the second protrusions are asymmetrical to each other with respect to a first direction in which the connection wirings extend,
wherein the core structure includes a plurality of openings that are fully encircled by the core structure.

2. The display device of claim 1, wherein respective first protrusions of the first protrusions are not aligned with corresponding second protrusions of the second protrusions along a second direction perpendicular to the first direction.

3. The display device of claim 2, wherein the first protrusions partially overlap the second protrusions along the second direction.

4. The display device of claim 2, wherein the first protrusions do not overlap the second protrusions along the second direction.

5. The display device of claim 1, wherein a first distance between two adjacent protrusions of the first protrusions or two adjacent protrusions of the second protrusions is smaller than a second distance between two adjacent connection wirings of the connection wirings.

6. The display device of claim 1, wherein the protrusions have at least partially rounded shape when viewed from a plan view.

7. The display device of claim 1, wherein the protrusions have an angled shape when viewed from a plan view.

8. The display device of claim 1, wherein the connection region is a bending region which is bent such that the display region and the non-display region are not coplanar.

9. The display device of claim 1, wherein the non-display region is a pad region and the wirings are a plurality of pad wirings.

10. A display device comprising:
a substrate including a display region, a non-display region spaced apart from the display region, and a connection region between the display region and the non-display region;
a plurality of pixel structures positioned in the display region;
a plurality of wirings positioned in the non-display region and including a core structure and a plurality of protrusions that extend from the core structure; and
a plurality of connection wirings electrically connecting the wirings to the pixel structures,
wherein the protrusions include a plurality of first protrusions positioned at a first side of the core structure of each of the wirings and a plurality of second protrusions positioned at a second side of the core structure of each of the wirings, the second side opposite to the first side,
wherein the first protrusions and the second protrusions are asymmetrical to each other with respect to a first direction in which the wirings extend,
wherein the core structure includes a plurality of openings that are fully encircled by the core structure.

11. The display device of claim 10, wherein respective first protrusions of the first protrusions are not aligned with corresponding second protrusions of the second protrusions along a second direction perpendicular to the first direction.

12. The display device of claim 11, wherein the first protrusions partially overlap the second protrusions along the second direction.

13. The display device of claim 11, wherein the first protrusions do not overlap the second protrusions along the second direction.

14. The display device of claim 10, wherein a first distance between two adjacent protrusions of the first protrusions or two adjacent protrusions of the second protrusions is smaller than a second distance between two adjacent wirings of the wirings.

15. The display device of claim 10, wherein the protrusions have at least partially rounded shape when viewed from a plan view.

16. The display device of claim 10, wherein the protrusions have an angled shape when viewed from a plan view.

17. The display device of claim 10, wherein the connection region is a bending region which is bent such that the display region and the non-display region are not coplanar.

18. The display device of claim 10, wherein the non-display region is a pad region and the wirings are a plurality of pad wirings.

19. The display device of claim 1, wherein each of the plurality of openings is substantially oval shaped.

20. The display device of claim 10, wherein each of the plurality of openings is substantially oval shaped.

* * * * *